(12) United States Patent
Sinharoy et al.

(10) Patent No.: US 11,138,762 B2
(45) Date of Patent: *Oct. 5, 2021

(54) VISUAL QUALITY OF VIDEO BASED POINT CLOUD COMPRESSION USING ONE OR MORE ADDITIONAL PATCHES

(71) Applicant: Samsung Electronics Co., Ltd., Suwon-si (KR)

(72) Inventors: Indranil Sinharoy, Richardson, TX (US); Madhukar Budagavi, Plano, TX (US); Rajan Laxman Joshi, San Diego, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 144 days.

This patent is subject to a terminal disclaimer.

(21) Appl. No.: 16/460,962

(22) Filed: Jul. 2, 2019

(65) Prior Publication Data

US 2020/0020132 A1    Jan. 16, 2020

Related U.S. Application Data

(60) Provisional application No. 62/696,722, filed on Jul. 11, 2018, provisional application No. 62/748,095, (Continued)

(51) Int. Cl.
*G06T 9/00* (2006.01)
*H03M 7/30* (2006.01)
(Continued)

(52) U.S. Cl.
CPC ............... *G06T 9/00* (2013.01); *G06T 3/40* (2013.01); *G06T 17/20* (2013.01); *H03M 7/3059* (2013.01)

(58) Field of Classification Search
CPC .. G06T 9/00; G06T 17/20; G06T 3/40; G06T 9/001; H03M 7/3059
See application file for complete search history.

(56) References Cited

U.S. PATENT DOCUMENTS 10,424,083 B2 * 9/2019 Sinharoy ................... G06T 7/73
2015/0138310 A1  5/2015 Fan et al.
(Continued)

OTHER PUBLICATIONS

ISA/KR, International Search Report and Written Opinion of the International Searching Authority, International Application No. PCT/KR2019/008429, dated Oct. 16, 2019, 7 pages.

(Continued)

*Primary Examiner* — Kim Y Vu
*Assistant Examiner* — Molly Delaney

(57) ABSTRACT

A decoding device, an encoding device and a method for point cloud decoding is disclosed. The method includes generating, for a 3D point cloud, a first 2D frame representing a first attribute and a second 2D frame representing a second attribute. The first 2D frame and the second 2D frame include respective clusters of projected points from the 3D point cloud. The method includes detecting missed points of the 3D point cloud and generating first and second additional points patches representing the first attribute and the second attribute, respectively, based on at least a subset of the missed points. The method includes including the first and second additional points patch in the first and second 2D frame, respectively. The method includes encoding the first 2D frame and the second 2D frame to generate a compressed bitstream and transmitting the compressed bitstream.

20 Claims, 16 Drawing Sheets

Related U.S. Application Data filed on Oct. 19, 2018, provisional application No. 62/782,470, filed on Dec. 20, 2018, provisional application No. 62/803,869, filed on Feb. 11, 2019, provisional application No. 62/817,239, filed on Mar. 12, 2019.

(51) Int. Cl.
*G06T 17/20* (2006.01)
*G06T 3/40* (2006.01)

(56) References Cited

U.S. PATENT DOCUMENTS

| | | |
|---|---|---|
| 2016/0086353 A1 | 3/2016 | Lukac et al. |
| 2017/0214943 A1 | 7/2017 | Cohen et al. |
| 2017/0316597 A1 | 11/2017 | Ceylan et al. |
| 2017/0347100 A1 | 11/2017 | Chou et al. |
| 2018/0101932 A1 | 4/2018 | Kwon et al. |
| 2018/0137224 A1* | 5/2018 | Hemmer .................. G06T 9/00 |
| 2018/0268570 A1 | 9/2018 | Budagavi et al. |
| 2019/0122393 A1* | 4/2019 | Sinharoy .............. G06K 9/6202 |
| 2019/0139266 A1* | 5/2019 | Budagavi ................ G06T 17/00 |
| 2019/0325614 A1* | 10/2019 | Melkote Krishnaprasad .............. G06T 9/40 |

OTHER PUBLICATIONS

Mammou et al., "Report on CE 2.4 lossless coding", ISO/IEC JTC1/SC29/WG11 MPEG2018/m43579, Jul. 2018, 3 pgs.
Extended European Search Report dated Jun. 16, 2021 regarding Application No. 19833892.3, 11 pages.
Sinharoy et al., "Lossless Coding in TMC2", ISO/IEC JTC1/SC29/WG11 MPEG2018/m42170, Jan. 2018, 10 pages.
Kitago et al., "Efficient and Prioritized Point Subsampling for CSRBF Compression". Eurographics Symposium on Point-Based Graphics, Jul. 2006, 9 pages.
Budagavi et al., "Samsung's response to CfP for Point Cloud Compression (Category 2)", ISO/IEC JTC1/SC29/WG11 MPEG2017/M4ISD8, Oct. 2017, 10 pages.

\* cited by examiner

VISUAL QUALITY OF VIDEO BASED POINT CLOUD COMPRESSION USING ONE OR MORE ADDITIONAL PATCHES

CROSS-REFERENCE TO RELATED APPLICATION AND CLAIM OF PRIORITY

This application claims priority under 35 U.S.C. § 119(e) to U.S. Provisional Patent Application No. 62/696,722 filed on Jul. 11, 2018, U.S. Provisional Patent Application No. 62/748,095 filed on Oct. 19, 2018, U.S. Provisional Patent Application No. 62/782,470 filed on Dec. 20, 2018, U.S. Provisional Patent Application No. 62/803,869 filed on Feb. 11, 2019, and U.S. Provisional Patent Application No. 62/817,239 filed on Mar. 12, 2019. The above-identified provisional patent applications are hereby incorporated by reference in its entirety.

TECHNICAL FIELD

This disclosure relates generally to compression and coding of multimedia data. More specifically, this disclosure relates to compressing and decompressing point clouds.

BACKGROUND

Three hundred sixty degree (360°) video is emerging as a new way of experiencing immersive video due to the ready availability of powerful handheld devices such as smartphones. 360° video enables immersive "real life," "being there" experience for consumers by capturing the 360° view of the world. Users can interactively change their viewpoint and dynamically view any part of the captured scene or object they desire. Display and navigation sensors track head movement in real-time to determine the region of the 360° video that the user wants to view. 360° video provides a Three-Degrees-of-Freedom (3DoF) immersive experience. Six-Degrees-of-Freedom (6DoF) is the next level of immersive experience where in the user can turn his head as well as move around in a virtual/augmented environment. Multimedia data that is three-dimensional (3D) in nature, such as point clouds, is needed to provide 6DoF experience.

Point clouds and meshes are a set of 3D points that represent a model of a surface of an object or a scene. Point clouds are common in a variety of applications such as gaming, 3D maps, visualizations, medical applications, augmented reality, virtual reality, autonomous driving, multi-view replay, 6DoF immersive media, to name a few. Point clouds, if uncompressed, generally require a large amount of bandwidth for transmission. Due to the large bitrate requirement, point clouds are often compressed prior to transmission.

SUMMARY

This disclosure provides system and methods for improving visual quality of video based point cloud compression using additional patch.

In another embodiment an encoding device for point cloud encoding is provided. The encoding device includes a processor and a communication interface operably coupled to the processor. The processor is configured to generate, for a three-dimensional (3D) point cloud, a first two-dimensional (2D) frame representing a first attribute of the 3D point cloud and a second 2D frame representing a second attribute of the 3D point cloud. The first 2D frame and the second 2D frame include respective clusters of projected points from the 3D point cloud. The processor is configured to detect missed points of the 3D point cloud that are not included in the first 2D frame. The processor is configured to generate a first additional points patch representing the first attribute based on at least a subset of the missed points and a second additional points patch representing the second attribute based on at least the subset of the missed points. The processor is configured to include the first additional points patch in the first 2D frame and the second additional points patch in the second 2D frame. The processor is configured to encode the first 2D frame that include the first additional points patch and the second 2D frame that includes the second additional points patch to generate a compressed bitstream. The communication interface is configured to transmit the compressed bitstream.

In another embodiment, a decoding device for point cloud decoding is provided. The decoding device includes a communication interface and a processor that is operably coupled to the communication interface. The communication interface is configured to receive a compressed bitstream. The processor is configured to decode the compressed bitstream into a first two-dimensional (2D) frame representing a first attribute of a three-dimensional (3D) point cloud and a second 2D frame representing a second attribute of the 3D point cloud. The first 2D frame and the second 2D frame include respective clusters of projected points from the 3D point cloud. The processor is configured to identify in the first 2D frame a first additional points patch representing a subset of missed points of the 3D point cloud that are not included in the first 2D frame and in the second 2D frame a second additional points patch representing the subset of the missed points of the 3D point cloud that are not included in the first 2D frame. The processor is configured to generate, using the first 2D frame and the second 2D frame, the 3D point cloud using the respective clusters of projected points, the first additional points patch, and the second additional points patch.

In yet another embodiment a method for point cloud encoding is provided. The method includes generating, for a three-dimensional (3D) point cloud, a first two-dimensional (2D) frame representing a first attribute of the 3D point cloud and a second 2D frame representing a second attribute of the 3D point cloud. The first 2D frame and the second 2D frame include respective clusters of projected points from the 3D point cloud. The method includes detecting missed points of the 3D point cloud that are not included in the first 2D frame. The method includes generating a first additional points patch representing the first attribute based on at least a subset of the missed points and a second additional points patch representing the second attribute based on at least the subset of the missed points. The method includes including the first additional points patch in the first 2D frame and the second additional points patch in the second 2D frame. The method includes encoding the first 2D frame that include the first additional points patch and the second 2D frame that includes the second additional points patch to generate a compressed bitstream. The method includes transmitting the compressed bitstream.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
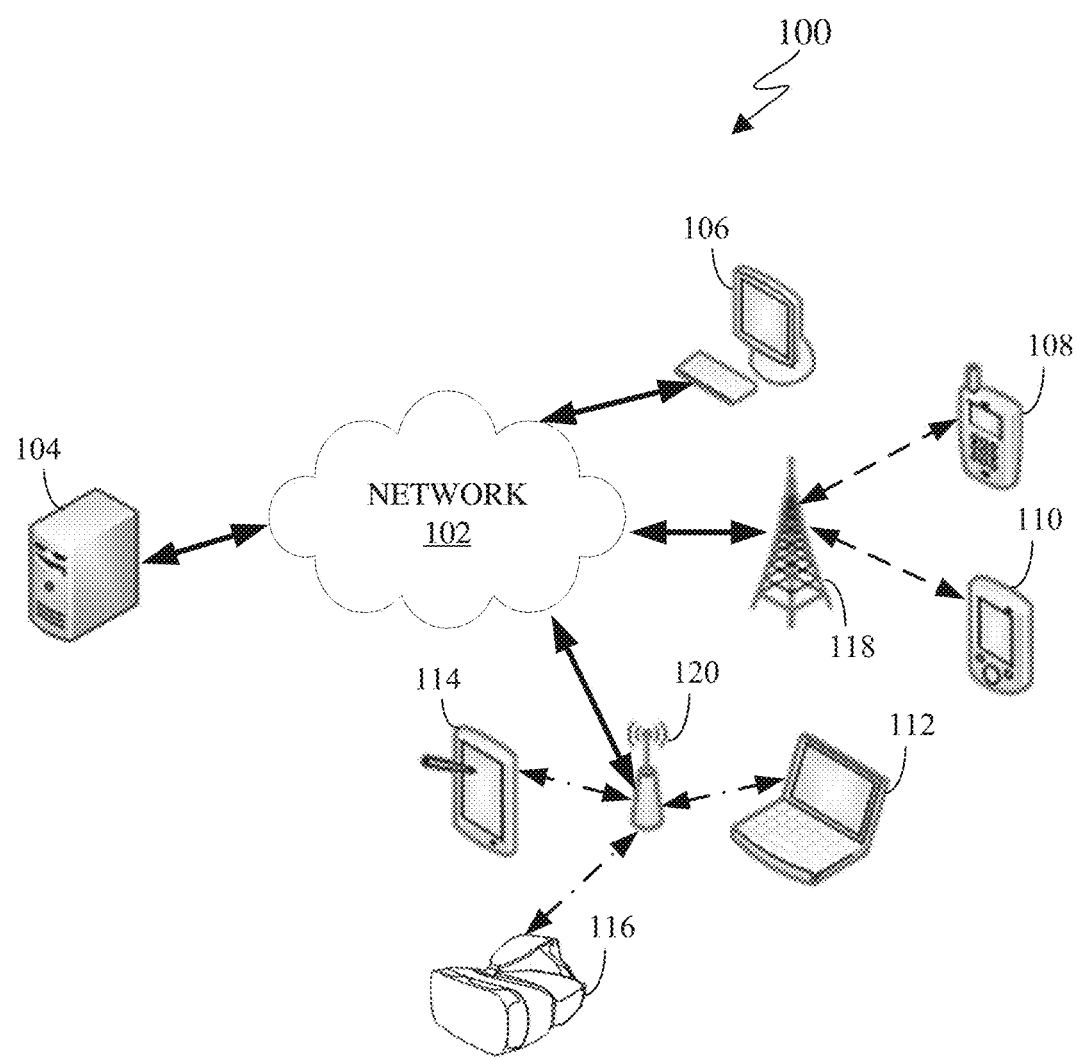
FIG. 1 illustrates an example communication system in accordance with an embodiment of this disclosure.

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably-arranged system or device.

Augmented reality (AR) is an interactive experience of a real world environment where objects that reside in the real-world environment are augmented with virtual objects, virtual information, or both. Virtual reality (VR) is a rendered version of a visual scene, where the entire scene is computer generated. In certain embodiments, AR and VR include both visual and audio experiences. A visual rendering is designed to mimic the visual stimuli, and if available audio sensory stimuli, of the real world as naturally as possible to an observer or user as the user moves within the limits defined by the application or the AR or VR scene. For example, VR places a user into immersive worlds that respond to the head movements of a user. At the video level, VR is achieved by providing a video experience that covers as much of the field of view (FOV) as possible together with the synchronization of the viewing angle of the rendered video with the head movements.

Many different types of devices are able to provide the immersive experience associated with AR or VR. One example device is a head-mounted display (HMD). A HMD is a device that enables a user to view the VR scene and adjust the displayed content based on movements of the head of the user. A HMD represents one of many types of devices that provide AR and VR experiences to a user. Typically, a HMD relies either on a dedicated screen that is integrated into a device and connected with an external computer (tethered) or on a device, such as a smartphone, that is inserted into the HMD (untethered). The first approach utilizes one or more lightweight screens and benefits from a high computing capacity. In contrast, the smartphone-based systems utilize higher mobility and can be less expensive to produce. In both instances, the video experience generated is the same. It is noted that as used herein, the term "user" may denote a human or another device (such as an artificial intelligent electronic device) using the electronic device.

A point cloud can be similar to an object in a VR or AR environment. A point cloud is a virtual representation of an object in three dimensions using multiple points. A 3D mesh is another type of a virtual representation of an object in a VR or AR environment. A 3D mesh illustrates the external structure of an object that is constructed of polygons. For example, a 3D mesh is a collection of vertices, edges, and faces that define the shape of an object. When the object is rendered, the vertices of the mesh, the corresponding texture coordinate, and the texture image are inputted into a graphical processing unit which maps the mesh onto the 3D geometry. Point clouds and meshes are illustrated and discussed in greater detail below with reference to FIG. 4A. A point cloud or a point mesh can be an object, multiple objects, a virtual scene (which includes multiple objects), and the like.

Point clouds and meshes are commonly used in a variety of applications, including gaming, 3D mapping, visualization, medicine, AR, VR, autonomous driving, multi-view replay, 6 degrees of freedom immersive media, to name a few. As used hereinafter, the term 'point cloud' also refers to a '3D point cloud,' and a '3D mesh.'

Point clouds consist of multiple 3D points positioned in 3D space. For example, a point cloud is a collection of points in 3D space, and each point includes at least one attribute. The attributers can include a geometry coordinate and at least one texture. The geometry coordinate represents the position of the point in a particular location within 3D space. Each point in a 3D point cloud includes a geometric position, represented by 3-tuple (X,Y,Z) coordinate values. When each point is identified by the three coordinates, a precise location in the 3D environment or space is identified. In certain embodiments, the location of each point within a 3D environment or space is relative to an origin or relative to other points of the point cloud, or a combination thereof. The origin is a location where the X, Y, and Z axis intersect. In certain embodiments, the points are positioned on the external surface of the object. In certain embodiments, the points are positioned throughout the internal structure and external surfaces of the object. In certain embodiments, the points are positioned on the external surface of the object at a certain thickness or depth.

Additionally, depending upon the application, each point in the point cloud can also include one or more textures such as color, reflectance, intensity, surface normal, material property, motion, and the like. In some embodiments, a single point of a 3D point cloud can have multiple textures. A texture can refer to an attribute other than the geometry attribute. A first attribute can represent the geometric position of a point, while a second attribute or texture can represent the color of the point, a third attribute or texture can represent the reflectiveness of the point, and yet the point can further be represented by additional attributes or textures such as intensity, surface normal, and the like. In some embodiments, an attribute refers only to a texture of a point, and not a geometric position of the points. In some applications, point clouds can also be used to approximate light field data in which, each point includes multiple view-dependent, color information (R, G, B triplets).

A point cloud includes numerous points and each point is associated with a geometric position and one or more textures. For example, a single point cloud can include billions of points, with each point associated with a geometric position and one or more textures. A geometric position and each texture that is associated with a point occupy a certain number of bits. For example, a geometric position of a single point in a point cloud can consume thirty bits. For instance, if each geometric position of a single point is defined with an X value, a Y value, and a Z value, then each coordinate (the X, the Y, and the Z) occupies ten bits, totaling the thirty bits. Similarly, a texture corresponding to the color of a point cloud can consume twenty-four bits. For instance, if a color component of a single point is defined based on a Red value, Green value, and Blue value, then each color component (Red, Green, and Blue) occupies eight bits, totaling the twenty-four bits. As a result, a single point with a ten bit geometric attribute data, per coordinate, and an eight bit color attribute data, per color value, occupies fifty-four bits. Each additional attribute increases the bits required for a single point. If a frame includes one million points, the number of bits per frame is fifty-four million bits (fifty-four bits per point times one million points per frame). If the frame rate is thirty frames per second and undergoes no compression, then 1.62 gigabytes per second (fifty-four million bits per frame times 30 frames per second) are to be transmitted from one electronic device to another in order for the second device to render and display the point cloud. As a result, due to the size and complexity of the data associated with a single point cloud, transmitting an uncompressed point cloud from one electronic device to another uses significant bandwidth.

Embodiments of the present disclosure take into consideration that certain dedicated hardware components can be used to meet the real-time demands or reduce delays or lags in the transmitting and rendering a point cloud however such hardware components are often expensive. Additionally, embodiments of the present disclosure take into consideration that compressing a point clouds is necessary to expedite and improve transmission of the point cloud from one device (such as a source device) to another device (such as a display device) due to the bandwidth necessary to transmit the point cloud. Compressing and decompressing a point cloud by leveraging existing video codecs enables the encoding and decoding of a point cloud to be widely available without the need for new or specialized hardware. However, many video codecs are not able to encode and decode 3D video content, such as a point cloud. According to embodiments of the present disclosure, leveraging existing video codecs can be utilized when the point cloud is converted from a 3D state to a 2D state. In certain embodiments, the conversion of a point cloud includes projecting the 3D point cloud onto 2D frames by creating patches (or clusters of points from the point cloud) that represent the point cloud and packing the patches into 2D frames. Thereafter, video codecs such as HEVC, AVC, VP9, VP8, JVNET, and the like can be used to compress the 2D frames representing the 3D point cloud similar to a 2D video.

Embodiments of the present disclosure provide systems and methods for converting a point cloud from a 3D state into a 2D state to efficiently compress and transmit the point cloud. A point cloud can be deconstructed, and multiple 2D frames are generated. The frames include regular patches representing the attributes of each point of the point cloud, such as a geometric position of the points in 3D space and at least one texture associated with each point geometric point. Converting the point cloud includes projecting the point cloud to generate multiple patches and packing the patches into onto one or more 2D frames, such that the frames can be compressed, and then transmitted to a display device. The frames can represent projections at different surface thicknesses of the point cloud. The frames can also represent different attributes of the point cloud, such as one frame includes geometry positions of the points and another frame includes texture information associated with each of the points.

During projection an encoder decomposes the point cloud into a set of patches by clustering the points of the point cloud into groups. The geometry and texture information of the points are separated and packed into different frames. For example, a set of frames include geometry information of the points and additional sets of frames include each type of texture information of the points. As a result, a set of geometry video frames are generated and for each texture of the 3D point cloud an additional set of texture frames are generated. For example, the geometry video frames are used to encode the geometry information, and the corresponding texture video frames are used to encode the texture (or other attributes) of the point cloud. Each point within a patch in the geometry video frame corresponds to a point in 3D space. The two transverse coordinates (with respect to the projection plane) of a 3D point corresponds to the column and row indices in the geometry video frame plus a transverse-offset which determines the location of the entire patch within the video frame. The depth of the 3D point is encoded as the value of the pixel in the video frame plus a depth-offset for the patch. The depth of the 3D point cloud depends on whether the projection of the 3D point cloud is taken from the XY, YZ, or XZ coordinates.

An encoder projects the point cloud onto multiple frames. The encoder can project the point cloud at different surface depths or layers onto respective frames. For example, if the encoder projects the point cloud based on two different layers, then two frames for each attribute can be generated. For instance, a first frame can include geometry (the geometric location in 3D space of each point) at the first layer, a second frame can include geometry (the geometric location in 3D space of each point) at the second layer, a third frame can include color of the points at the first layer, and a fourth frame can include color of the second layer. The more surface thickness are taken, the more frames are generated. Similarly, the more attributes that are used to define the 3D point cloud also increases the number of frames that are generated. The encoder projects the 3D point cloud onto the multiple 2D frames and generates a bitstream. The frames can be compressed by leveraging various video compression codecs, image compression codecs, or both. In certain embodiments, frames representing different attributes (including the geometric positions of the points) are encoded and decoded separately. In other embodiments, frames representing different attributes (including the geometric positions of the points) are encoded and decoded together. The encoder or another device then transmits the bitstream to different device. When the point cloud is deconstructed to fit on multiple frames (such as the 2D frames), and compressed the frames can be transmitted using less bandwidth than transmitting the original point cloud. A sequence of point cloud frames (both a set of geometry frames and each set of texture frames) are similar to a video which is a sequence of image frames.

In certain embodiments, the height and width of a group of frames (GOF) representing geometry and texture is constant for the GOF. The height and width can change from one GOF to another GOF. As such, the geometry and texture frames corresponding to a GOF are compressed as a video sequence independently from another GOF's with a different height and width. In certain embodiments, when the video sequence is compressed using a system on chic (SOC) based video codec the height and width of frames is constant for every GOF in an entire point cloud sequence. For example, a SOC video codec requires time to switch from one video size to another video size since line buffers need to be reallocated and the overall memory allocations are changed to accommodate changes in frame sizes.

Embodiments of the present disclosure recognize and take into consideration that the size of geometry and texture frames depends on the number and size of patches and their packing by the encoder. Therefore, to increase efficiency, finding the overall maximum height and width of geometry and texture frames. However, identifying the maximum height and width would utilizes significant memory to buffer all depth and texture frames as well as the patch data. Moreover, choosing the maximum height and width for all geometry and texture frames would result in loss of compression efficiency for frames that are too large. Additionally, choosing the maximum height and width for all geometry and texture frames makes lossless compression of the point cloud impossible. However, if a smaller than maximum size is selected for the entirety of the frames, various patches (or portions of patches) could be discarded which would introduce sever artifacts including holes and cracks in the reconstructed point cloud.

Embodiments of the present disclosure also provide systems and methods to ensure that size of the video frames is constant throughout the point cloud sequence. In certain embodiments, the frame width is the same of all GOF's in a bitstream. In certain embodiments, a flag is signaled at the frame level indicating that missed points are explicitly signaled as auxiliary information. For example if a flag titled 'additional_point_data_present_flag' is signaled (the flag is set to 1) at the frame level the additional points (such as points that are missed during the projection) are explicitly signaled as auxiliary information. In certain embodiments, if the size of the geometry and the texture frame exceed the signaled size, the entire point cloud frame is set directly as geometry and texture of frames using all three components. When entire point cloud frame is set directly as geometry and texture of frames using all three components, no occupancy map and patch information is signaled. That is, embodiments of the present disclosure also provide systems and methods to send additional points (missed points) as auxiliary information or directly coding the position and texture information into the geometry and texture frames without crating patches and projections.

Embodiments of the present disclosure also provide systems and methods to select the frame height and frame width after a few frames have been processed. For example, the frame height and frame width can be selected without finding the patch information for all of the frames. When the frame size is constant across the entire sequence the increases the efficiency of an SOC video encoder.

Using multiple geometry and its correspondingly texture frames enables point cloud encoding even if the point cloud includes surface irregularities. Surface irregularities can arise from quantization, self-occlusions, noise during capture, and the like. Surface irregularities can arise when several points of the point cloud are project to the same location in the 2D video frame.

A quantization parameter can be used while encoding the frames. A quantization parameter (QP) determines the quantization step size. A lower QP will result in higher video quality while a higher QP will results in lower video quality. In certain embodiments, QP values can differ between geometry frames and texture frames. For example, a QP of sixteen can be used for encoding geometry frames, while a QP of twenty-two is used for encoding texture frames.

A decoder can receive the bitstream from the encoder, another device, or an information repository source and then decompresses the bitstream into the frames, and reconstructs the point cloud based on the information within the frames. The decoder can then reconstruct the patches within the 2D frames to generate the 3D point cloud which can be rendered on a display and viewed by a user.

Certain points of the 3D point cloud can be missed when the points are projected onto 2D frames by an encoder. When several points from close neighborhoods are missed during the projection, several cracks and holes are observed in the reconstructed point cloud. Artifacts, such as the cracks and holes can be introduced in the reconstructed point cloud as certain points were not transmitted from the original 3D point cloud. Artifacts, including holes and cracks, are detrimental to the visual quality and experience of immersive media. For example, when a point is not projected from the point cloud, the point is not included in a 2D frames, and as such when the point cloud is reconstructed by the decoder cracks and holes can be introduced in the reconstructed point cloud.

A point is missed when it is not projected from 3D point cloud to a patch on a 2D video frame. Missed points generally occur near regions of high curvature in the point cloud surface or due to self-occlusions. Additionally, some isolated 3D points are not included in the regular patches as these points they fail to comply with the constraints imposed during the projection onto the 2D frames. For example, the constraints can include a maximum depth constraint, distance from other points in the neighborhood, and the like. Further, if two or more points are projected to the same pixel location on a 2D frame, then one of those points can be written over or missed entirely.

For example, when several points of a point cloud are in close proximity to each other are missed during the projection; one or more cracks or holes can be observed in the reconstructed point cloud. The cracks and holes are not a compression artifact but rather a consequence of the 3D to 2D projection of the geometry of the points cloud. That is, cracks and holes can occur regardless of lossless mode or lossy mode compression, since these artifacts are caused by the projection of the 3D point cloud into 2D frames and not due to compressing the frames. The appearance of holes cracks and other artifacts in the reconstructed point cloud can be detrimental to the visual quality of the reconstructed point cloud.

Embodiments of the present disclosure also provide systems and methods for reducing the appearance of holes, cracks, and other artifacts in a reconstructed point cloud. Since multiple points can be projected to the same pixel location on a 2D frame, multiple projections can be utilized to capture the points of the point cloud at different depths or layers. A near layer stores the points which are closest to the projection plane, while a far layer stores points a further distance from the projection plane. The surface thickness is the distance between the near layer and the far layer. In certain embodiments, two geometry video frames and two texture video frames are generated by the encoder, which represent a 3D point cloud. In certain embodiments, more than two layers are generated by taking more than two projections at different depths, such that three or more geometry video frames and three or more texture video frames are generated by the encoder. The multiple frames represent the same projection but at different depths into the point cloud. A first layer can store points that are closest to the projection plane, while a second layer can store points further from the projection plane. In certain embodiments, the surface thickness is predetermined.

Embodiments of the present disclosure provide systems and methods for improving the visual quality of a reconstructed point cloud by using one or more additional points patches that include the points or a subset of the points that were not missed during the 3D to 2D projection. The additional points patch can be included in lossy compression mode. In certain embodiments, an additional points patch can include all or a portion of the missed points. Improving the reconstruction of a 3D point cloud decreases the appearance of cracks or holes in the point cloud FIG. 1 illustrates an example communication system 100 in accordance with an embodiment of this disclosure. The embodiment of the communication system 100 shown in FIG. 1 is for illustration only. Other embodiments of the communication system 100 can be used without departing from the scope of this disclosure.

The communication system 100 includes a network 102 that facilitates communication between various components in the communication system 100. For example, the network 102 can communicate IP packets, frame relay frames, Asynchronous Transfer Mode (ATM) cells, or other information between network addresses. The network 102 includes one or more local area networks (LANs), metropolitan area networks (MANs), wide area networks (WANs), all or a portion of a global network such as the Internet, or any other communication system or systems at one or more locations.

In this example, the network 102 facilitates communications between a server 104 and various client devices 106-116. The client devices 106-116 may be, for example, a smartphone, a tablet computer, a laptop, a personal computer, a wearable device, a HMD, or the like. The server 104 can represent one or more servers. Each server 104 includes any suitable computing or processing device that can provide computing services for one or more client devices, such as the client devices 106-116. Each server 104 could, for example, include one or more processing devices, one or more memories storing instructions and data, and one or more network interfaces facilitating communication over the network 102. As described in more detail below, the server 104 can transmit a compressed bitstream, representing a point cloud, to one or more display devices, such as a client device 106-116. In certain embodiments, each server 104 can include an encoder.

Each client device 106-116 represents any suitable computing or processing device that interacts with at least one server (such as the server 104) or other computing device(s) over the network 102. The client devices 106-116 include a desktop computer 106, a mobile telephone or mobile device 108 (such as a smartphone), a PDA 110, a laptop computer 112, a tablet computer 114, and a HMD 116. However, any other or additional client devices could be used in the communication system 100. Smartphones represent a class of mobile devices 108 that are handheld devices with mobile operating systems and integrated mobile broadband cellular network connections for voice, short message service (SMS), and Internet data communications. The HMD 116 can display 360° scenes including one or more 3D point clouds. In certain embodiments, any of the client devices 106-116 can include an encoder, decoder, or both. For example, the mobile device 108 can record a video and then encode the video enabling the video to be transmitted to one of the client devices 106-116. In another example, the laptop computer 112 can be used to generate a virtual 3D point cloud, which is then encoded and transmitted to one of the client devices 106-116.

In this example, some client devices 108-116 communicate indirectly with the network 102. For example, the mobile device 108 and PDA 110 communicate via one or more base stations 118, such as cellular base stations or eNodeBs (eNBs). Also, the laptop computer 112, the tablet computer 114, and the HMD 116 communicate via one or more wireless access points 120, such as IEEE 802.11 wireless access points. Note that these are for illustration only and that each client device 106-116 could communicate directly with the network 102 or indirectly with the network 102 via any suitable intermediate device(s) or network(s). In certain embodiments, the server 104 or any client device 106-116 can be used to compress a point cloud, generate a bitstream that represents the point cloud, and transmit the bitstream to another client device such as any client device 106-116.

In certain embodiments, any of the client devices 106-114 transmit information securely and efficiently to another device, such as, for example, the server 104. Also, any of the client devices 106-116 can trigger the information transmission between itself and server 104. Any of the client devices 106-114 can function as a VR display when attached to a headset via brackets, and function similar to HMD 116. For example, the mobile device 108 when attached to a bracket system and worn over the eyes of a user can function similarly as the HMD 116. The mobile device 108 (or any other client device 106-116) can trigger the information transmission between itself and server 104

In certain embodiments, any of the client devices 106-116 or the server 104 can create a 3D point cloud, compress a 3D point cloud, transmit a 3D point cloud, receive a 3D point cloud, render a 3D point cloud, or a combination thereof. For example, the server 104 can then compress 3D point cloud to generate a bitstream and then transmit the bitstream to one or more of the client devices 106-116. For another example, one of the client devices 106-116 can compress a 3D point cloud to generate a bitstream and then transmit the bitstream to another one of the client device 106-116 or to the server 104.

Although FIG. 1 illustrates one example of a communication system 100, various changes can be made to FIG. 1. For example, the communication system 100 could include any number of each component in any suitable arrangement. In general, computing and communication systems come in a wide variety of configurations, and FIG. 1 does not limit the scope of this disclosure to any particular configuration. While FIG. 1 illustrates one operational environment in which various features disclosed in this patent document can be used, these features could be used in any other suitable system.

Figure 2:
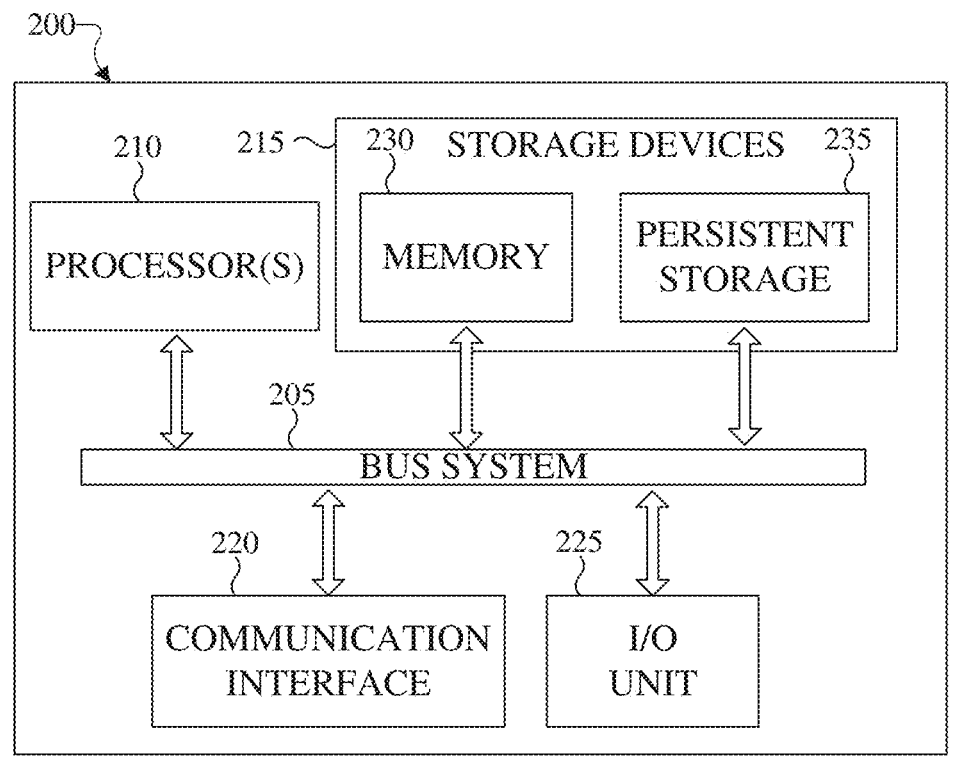
FIGS. 2 and 3 illustrate example electronic devices in accordance with an embodiment of this disclosure.
Figure 3:
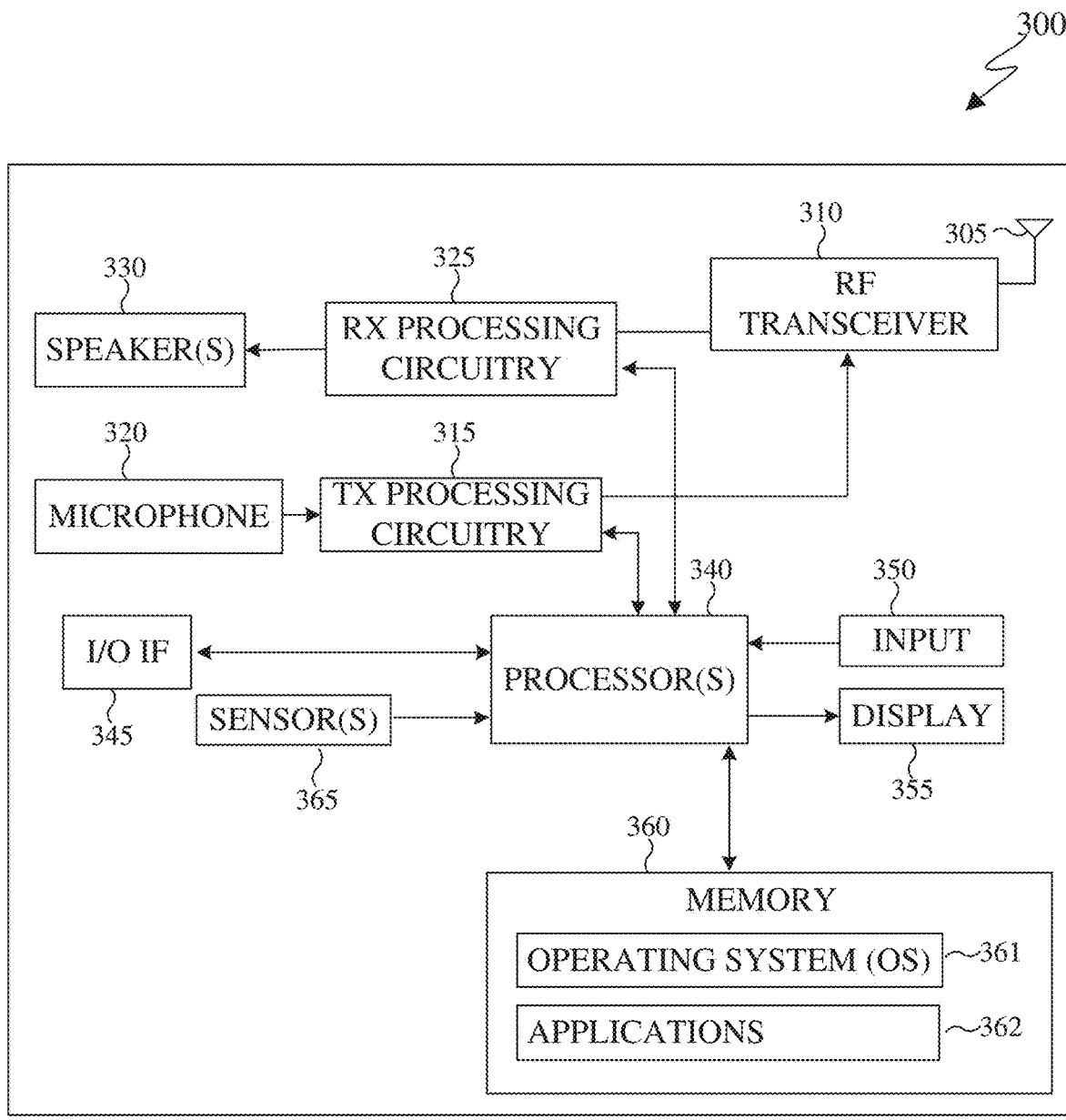

FIGS. 2 and 3 illustrate example electronic devices in accordance with an embodiment of this disclosure. In particular, FIG. 2 illustrates an example server 200, and the server 200 could represent the server 104 in FIG. 1. The server 200 can represent one or more local servers, one or more remote servers, clustered computers, and components that act as a single pool of seamless resources, a cloud-based server, and the like. The server 200 can be accessed by one or more of the client devices 106-116 of FIG. 1 or another server.

The server 200 can represent one or more local servers, one or more compression servers, or one or more encoding servers, such as an encoder. In certain embodiments, the encoder can perform decoding. As shown in FIG. 2, the server 200 includes a bus system 205 that supports communication between at least one processing device (such as a processor 210), at least one storage device 215, at least one communications interface 220, and at least one input/output (I/O) unit 225.

The processor 210 executes instructions that can be stored in a memory 230. The processor 210 can include any suitable number(s) and type(s) of processors or other devices in any suitable arrangement. Example types of processors 210 include microprocessors, microcontrollers, digital signal processors, field programmable gate arrays, application specific integrated circuits, and discrete circuitry. In certain embodiments, the processor 210 can encode a 3D point cloud stored within the storage devices 215. In certain embodiments, encoding a 3D point cloud also decodes the 3D point cloud to ensure that when the point cloud is reconstructed, the reconstructed 3D point cloud matches the 3D point cloud prior to the encoding.

The memory 230 and a persistent storage 235 are examples of storage devices 215 that represent any structure(s) capable of storing and facilitating retrieval of information (such as data, program code, or other suitable information on a temporary or permanent basis). The memory 230 can represent a random access memory or any other suitable volatile or non-volatile storage device(s). For example, the instructions stored in the memory 230 can include instructions for decomposing a point cloud into patches, instructions for packing the patches on 2D frames, instructions for compressing the 2D frames, as well as instructions for encoding 2D frames in a certain order in order to generate a bitstream. The instructions stored in the memory 230 can also include instructions for rendering the point cloud on an omnidirectional 360° scene, as viewed through a VR headset, such as HMD 116 of FIG. 1. The persistent storage 235 can contain one or more components or devices supporting longer-term storage of data, such as a read only memory, hard drive, Flash memory, or optical disc.

The communications interface 220 supports communications with other systems or devices. For example, the communications interface 220 could include a network interface card or a wireless transceiver facilitating communications over the network 102 of FIG. 1. The communications interface 220 can support communications through any suitable physical or wireless communication link(s). For example, the communications interface 220 can transmit a bitstream containing a 3D point cloud to another device such as one of the client devices 106-116.

The I/O unit 225 allows for input and output of data. For example, the I/O unit 225 can provide a connection for user input through a keyboard, mouse, keypad, touchscreen, or other suitable input device. The I/O unit 225 can also send output to a display, printer, or other suitable output device. Note, however, that the I/O unit 225 can be omitted, such as when I/O interactions with the server 200 occur via a network connection.

Note that while FIG. 2 is described as representing the server 104 of FIG. 1, the same or similar structure could be used in one or more of the various client devices 106-116. For example, a desktop computer 106 or a laptop computer 112 could have the same or similar structure as that shown in FIG. 2.

FIG. 3 illustrates an example electronic device 300, and the electronic device 300 could represent one or more of the client devices 106-116 in FIG. 1. The electronic device 300 can be a mobile communication device, such as, for example, a mobile station, a subscriber station, a wireless terminal, a desktop computer (similar to the desktop computer 106 of FIG. 1), a portable electronic device (similar to the mobile device 108, the PDA 110, the laptop computer 112, the tablet computer 114, or the HMD 116 of FIG. 1), and the like. In certain embodiments, one or more of the client devices 106-116 of FIG. 1 can include the same or similar configuration as the electronic device 300. In certain embodiments, the electronic device 300 is an encoder, a decoder, or both. For example, the electronic device 300 is usable with data transfer, image or video compression, image or video decompression, encoding, decoding, and media rendering applications.

As shown in FIG. 3, the electronic device 300 includes an antenna 305, a radio-frequency (RF) transceiver 310, transmit (TX) processing circuitry 315, a microphone 320, and receive (RX) processing circuitry 325. The RF transceiver 310 can include, for example, a RF transceiver, a BLUETOOTH transceiver, a WI-FI transceiver, a ZIGBEE transceiver, an infrared transceiver, and various other wireless communication signals. The electronic device 300 also includes a speaker 330, a processor 340, an input/output (I/O) interface (IF) 345, an input 350, a display 355, a memory 360, and a sensor(s) 365. The memory 360 includes an operating system (OS) 361, and one or more applications 362.

The RF transceiver 310 receives, from the antenna 305, an incoming RF signal transmitted from an access point (such as a base station, WI-FI router, or BLUETOOTH device) or other device of the network 102 (such as a WI-FI, BLUETOOTH, cellular, 5G, LTE, LTE-A, WiMAX, or any other type of wireless network). The RF transceiver 310 down-converts the incoming RF signal to generate an intermediate frequency or baseband signal. The intermediate frequency or baseband signal is sent to the RX processing circuitry 325 that generates a processed baseband signal by filtering, decoding, and/or digitizing the baseband or intermediate frequency signal. The RX processing circuitry 325 transmits the processed baseband signal to the speaker 330 (such as for voice data) or to the processor 340 for further processing (such as for web browsing data).

The TX processing circuitry 315 receives analog or digital voice data from the microphone 320 or other outgoing baseband data from the processor 340. The outgoing baseband data can include web data, e-mail, or interactive video game data. The TX processing circuitry 315 encodes, multiplexes, and/or digitizes the outgoing baseband data to generate a processed baseband or intermediate frequency signal. The RF transceiver 310 receives the outgoing processed baseband or intermediate frequency signal from the TX processing circuitry 315 and up-converts the baseband or intermediate frequency signal to an RF signal that is transmitted via the antenna 305.

The processor 340 can include one or more processors or other processing devices. The processor 340 can execute instructions that are stored in the memory 360, such as the OS 361 in order to control the overall operation of the electronic device 300. For example, the processor 340 could control the reception of forward channel signals and the transmission of reverse channel signals by the RF transceiver 310, the RX processing circuitry 325, and the TX processing circuitry 315 in accordance with well-known principles. The processor 340 can include any suitable number(s) and type(s) of processors or other devices in any suitable arrangement. For example, in certain embodiments, the processor 340 includes at least one microprocessor or microcontroller. Example types of processor 340 include microprocessors, microcontrollers, digital signal processors, field programmable gate arrays, application specific integrated circuits, and discrete circuitry.

The processor 340 is also capable of executing other processes and programs resident in the memory 360, such as operations that receive and store data. The processor 340 can move data into or out of the memory 360 as required by an executing process. In certain embodiments, the processor 340 is configured to execute the one or more applications 362 based on the OS 361 or in response to signals received from external source(s) or an operator. Example, applications 362 can include an encoder, a decoder, a VR or AR application, a camera application (for still images and videos), a video phone call application, an email client, a social media client, a SMS messaging client, a virtual assistant, and the like. In certain embodiments, the processor 340 is configured to receive and transmit media content.

The processor 340 is also coupled to the I/O interface 345 that provides the electronic device 300 with the ability to connect to other devices, such as client devices 106-114. The I/O interface 345 is the communication path between these accessories and the processor 340.

The processor 340 is also coupled to the input 350 and the display 355. The operator of the electronic device 300 can use the input 350 to enter data or inputs into the electronic device 300. The input 350 can be a keyboard, touchscreen, mouse, track ball, voice input, or other device capable of acting as a user interface to allow a user in interact with the electronic device 300. For example, the input 350 can include voice recognition processing, thereby allowing a user to input a voice command. In another example, the input 350 can include a touch panel, a (digital) pen sensor, a key, or an ultrasonic input device. The touch panel can recognize, for example, a touch input in at least one scheme, such as a capacitive scheme, a pressure sensitive scheme, an infrared scheme, or an ultrasonic scheme. The input 350 can be associated with the sensor(s) 365 and/or a camera by providing additional input to the processor 340. In certain embodiments, the sensor 365 includes one or more inertial measurement units (IMUs) (such as accelerometers, gyroscope, and magnetometer), motion sensors, optical sensors, cameras, pressure sensors, heart rate sensors, altimeter, and the like. The input 350 can also include a control circuit. In the capacitive scheme, the input 350 can recognize touch or proximity.

The display 355 can be a liquid crystal display (LCD), light-emitting diode (LED) display, organic LED (OLED), active matrix OLED (AMOLED), or other display capable of rendering text and/or graphics, such as from websites, videos, games, images, and the like. The display 355 can be sized to fit within a HMD. The display 355 can be a singular display screen or multiple display screens capable of creating a stereoscopic display. In certain embodiments, the display 355 is a heads-up display (HUD).

The memory 360 is coupled to the processor 340. Part of the memory 360 could include a RAM, and another part of the memory 360 could include a Flash memory or other ROM. The memory 360 can include persistent storage (not shown) that represents any structure(s) capable of storing and facilitating retrieval of information (such as data, program code, and/or other suitable information). The memory 360 can contain one or more components or devices supporting longer-term storage of data, such as a read only memory, hard drive, Flash memory, or optical disc. The memory 360 also can contain media content. The media content can include various types of media such as images, videos, three-dimensional content, VR content, AR content, 3D point clouds, and the like.

The electronic device 300 further includes one or more sensors 365 that can meter a physical quantity or detect an activation state of the electronic device 300 and convert metered or detected information into an electrical signal. For example, the sensor 365 can include one or more buttons for touch input, a camera, a gesture sensor, an IMU sensors (such as a gyroscope or gyro sensor and an accelerometer), an eye tracking sensor, an air pressure sensor, a magnetic sensor or magnetometer, a grip sensor, a proximity sensor, a color sensor, a bio-physical sensor, a temperature/humidity sensor, an illumination sensor, an Ultraviolet (UV) sensor, an Electromyography (EMG) sensor, an Electroencephalogram (EEG) sensor, an Electrocardiogram (ECG) sensor, an IR sensor, an ultrasound sensor, an iris sensor, a fingerprint sensor, a color sensor (such as a Red Green Blue (RGB) sensor), and the like. The sensor 365 can further include control circuits for controlling any of the sensors included therein.

As discussed in greater detail below, one or more of these sensor(s) 365 may be used to control a user interface (UI), detect UI inputs, determine the orientation and facing the direction of the user for three-dimensional content display identification, and the like. Any of these sensor(s) 365 may be located within the electronic device 300, within a secondary device operably connected to the electronic device 300, within a headset configured to hold the electronic device 300, or in a singular device where the electronic device 300 includes a headset.

The electronic device 300 can create media content such as generate a virtual object or capture (or record) content through a camera. The electronic device 300 can encode the media content to generate a bitstream, such that the bitstream can be transmitted directly to another electronic device or indirectly such as through the network 102 of FIG. 1. The electronic device 300 can receive a bitstream directly from another electronic device or indirectly such as through the network 102 of FIG. 1.

When encoding media content, such as a point cloud, the electronic device 300 can project the point cloud into multiple patches. For example, a cluster of points of the point cloud can be grouped together to generate a patch. A patch can represent a single attribute of the point cloud, such as geometry, color, and the like. Patches that represent the same attribute can be packed into individual 2D frames, respectively. The 2D frames are then encoded to generate a bitstream. During the encoding process additional content can be included such as metadata, flags, occupancy maps, and the like.

Similarly, when decoding media content, such as a bitstream that represents a 3D point cloud, the electronic device 300 decodes the received bitstream into frames. In certain embodiments, the decoded bitstream also includes an occupancy map. The decoded bitstream can also include one or more flags, or quantization parameter size, or any combination thereof. A geometry frame can include points that indicate coordinates, such as a geographic location of each point of a point cloud. Similarly, a color frame can include points that indicate the RGB color of each geometric point of the point cloud. In certain embodiments, an individual frame can include points from different surface thicknesses (such as different depths or layers). In certain embodiments, after reconstructing the 3D point cloud, the electronic device 300 can render the 3D point cloud in three dimensions via the display 355.

Although FIGS. 2 and 3 illustrate examples of electronic devices, various changes can be made to FIGS. 2 and 3. For example, various components in FIGS. 2 and 3 could be combined, further subdivided, or omitted and additional components could be added according to particular needs. As a particular example, the processor 340 could be divided into multiple processors, such as one or more central processing units (CPUs) and one or more graphics processing units (GPUs). In addition, as with computing and communication, electronic devices and servers can come in a wide variety of configurations, and FIGS. 2 and 3 do not limit this disclosure to any particular electronic device or server.

Figure 4A:
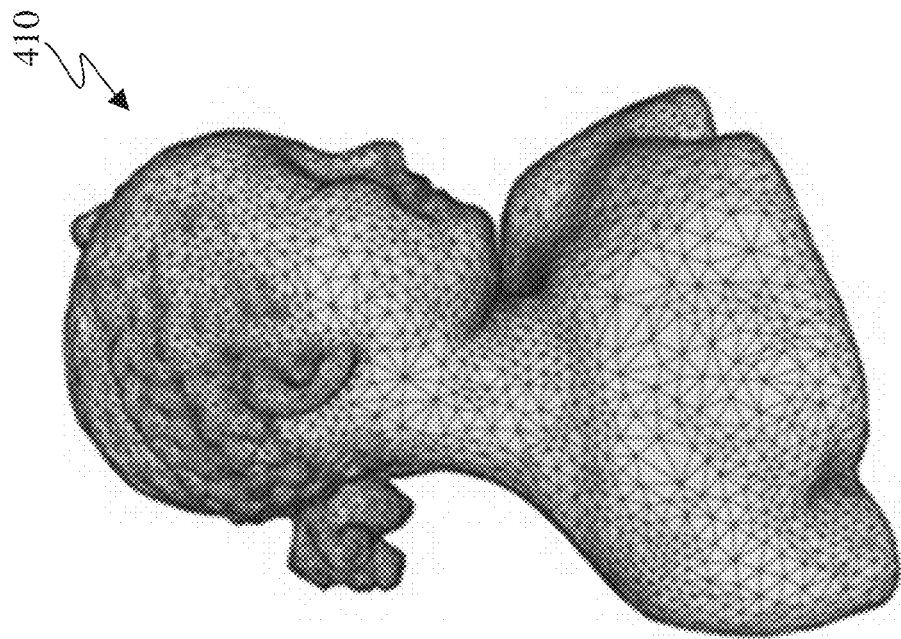
FIG. 4A illustrates an example point cloud and an example mesh in accordance with an embodiment of this disclosure.
Figure 4A:
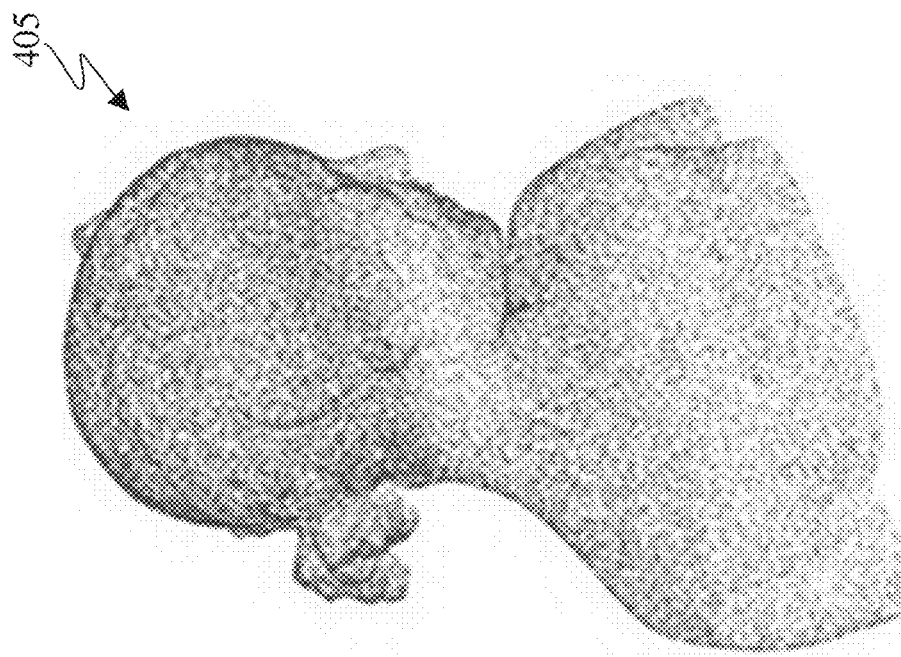

FIG. 4A illustrates an example point cloud 405 and an example mesh 410 in accordance with an embodiment of this disclosure. The point cloud 405 depicts an illustration of a point cloud. The point cloud 405 includes multiple points that visually define an object in 3D space. Each point of the point cloud represents an external coordinate of the object, similar to a topographical map. For example, each point can include one or more attributes. The attributes can include geometry, such as a geographical location of each point of the point cloud. The attributes of each point can also include a texture such as color, intensity, motion, material properties, reflectiveness, and the like.

Similarly, the mesh 410 depicts an illustration of a 3D mesh. The mesh 410 illustrates the external structure of an object that is built out of polygons. For example, the mesh 410 is a collection of vertices, edges, and faces that define the shape of an object. The mesh 410 is defined by many polygonal or triangular interconnectivity of information between the various points. Each polygon of the mesh 410 represents the external surface of the object. The vertices of each polygon are similar to the points in the point cloud 405. Each polygon can include information, such as an attribute. The attribute can include geometry and texture. Texture includes color, reflectiveness, motion, and the like. For example, topological data provide connectivity information among vertices such as adjacency of vertices, edges, and faces. Geometrical information provides the geometric location of each vertex in 3D space.

Although FIG. 4A illustrates one example of a point cloud and a point mesh, various changes can be made to FIG. 4A. For example, a point cloud and a point mesh can represent multiple objects rather than a single object. In another example, a point cloud and a point mesh can include movement instead of a still image.

Figure 4B:
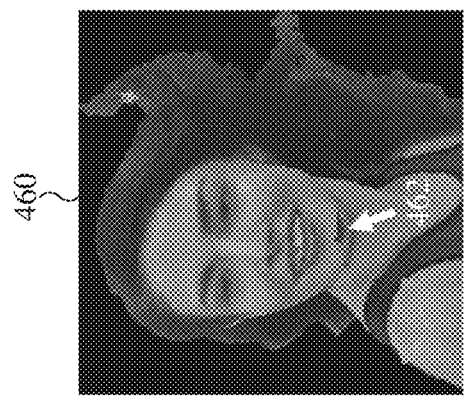
FIG. 4B illustrates an example original point cloud and a reconstructed point cloud in accordance with an embodiment of this disclosure.
Figure 4B:

FIG. 4B illustrates an example original point cloud 450 and a reconstructed point cloud 460 in accordance with an embodiment of this disclosure. The original point cloud 450 and the reconstructed point cloud 460 are similar to the point cloud 405 of FIG. 4A. The original point cloud 450 and the reconstructed point cloud 460 can represent an entire point cloud or a portion of point cloud. The original point cloud 450 and the reconstructed point cloud 460 are for illustration only. Other embodiments can be used without departing from the scope of this disclosure.

The original point cloud 450 represents an original point cloud, while the reconstructed point cloud 460 represents the original point cloud 450 after it was projected onto one or more frames, encoded, decompressed, reconstructed, and rendered. The reconstructed point cloud 460 includes a hole 462. During the projection of the original point cloud 450, certain pixels at the hole 462 were missed. The missed points cause the appearance of cracks and holes, such as the hole 462, in the reconstructed point cloud 460.

Although FIG. 4B illustrates one example of a crack of a whole in a reconstructed point cloud, various changes can be made to FIG. 4B. For example, any number of pixels can be missed during the projection of the point cloud causing artifacts anywhere in the reconstructed point cloud.

Figure 5A:
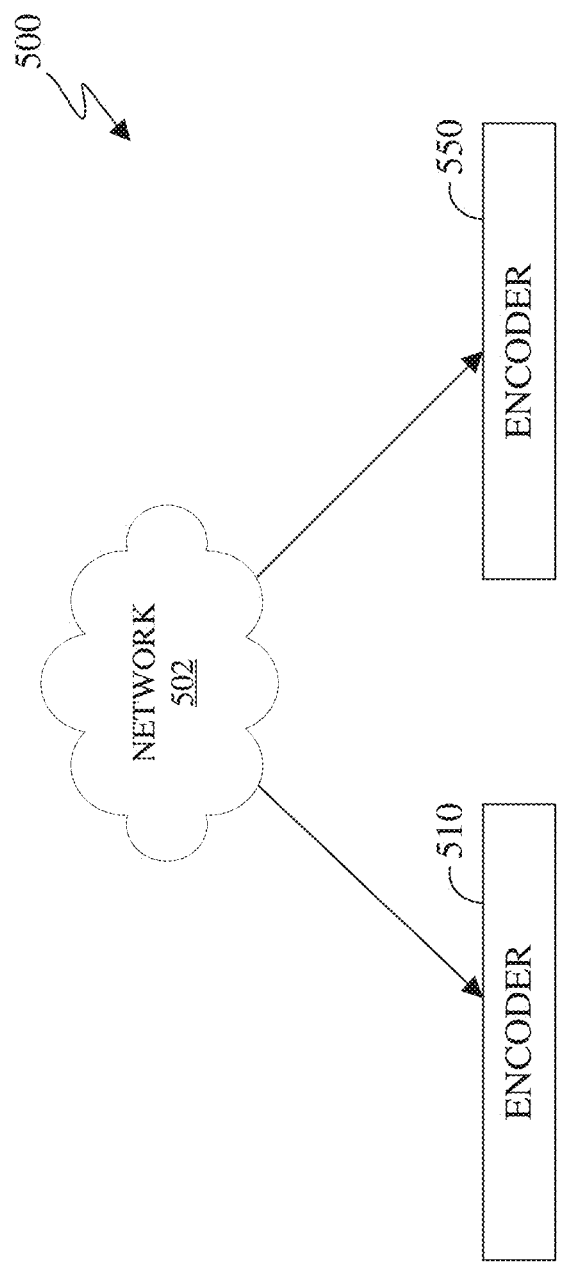
FIG. 5A illustrates a block diagram of an example environment-architecture in accordance with an embodiment of this disclosure.
Figure 5B:
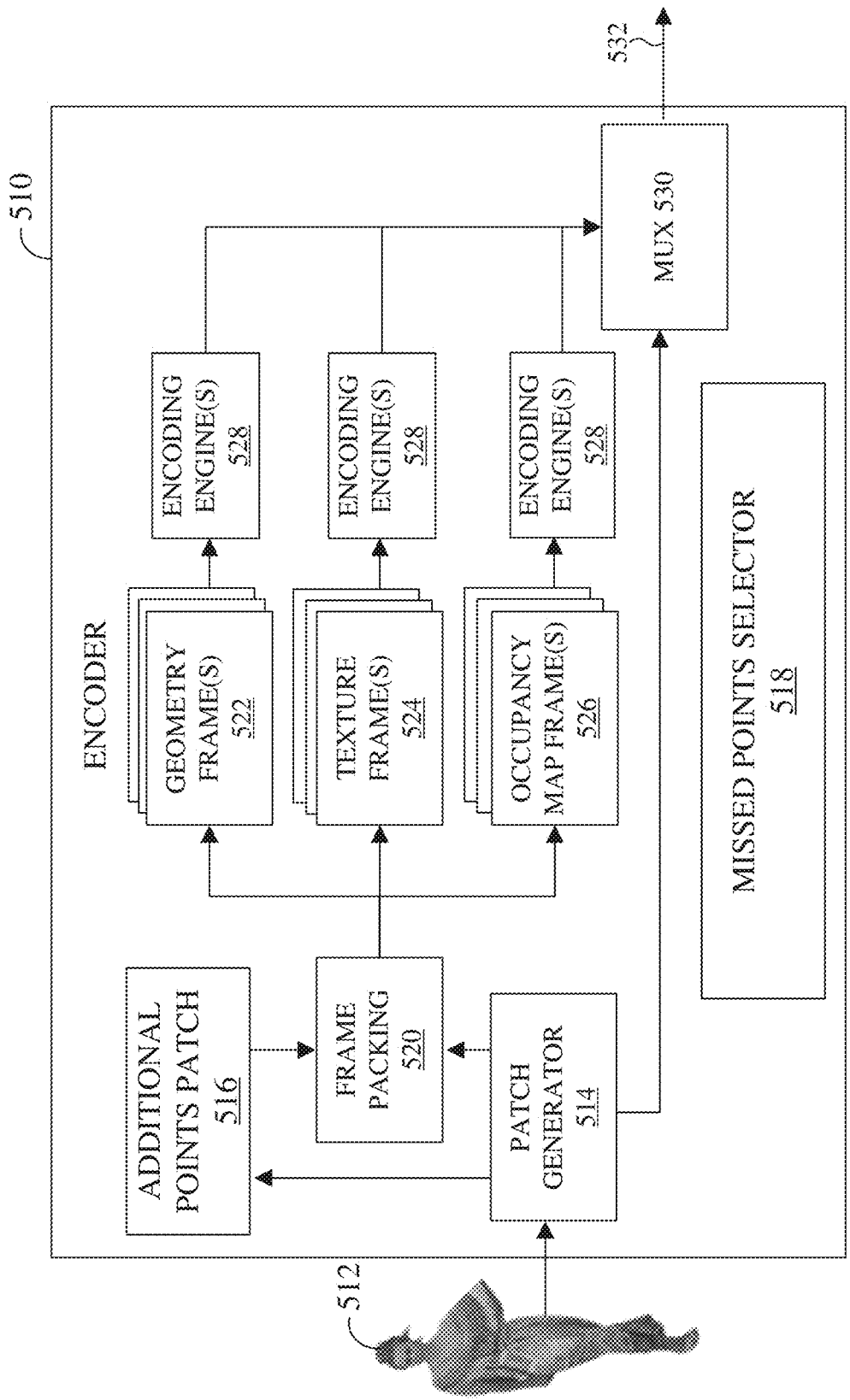
FIG. 5B illustrates an example block diagram of an encoder in accordance with an embodiment of this disclosure.
Figure 5C:
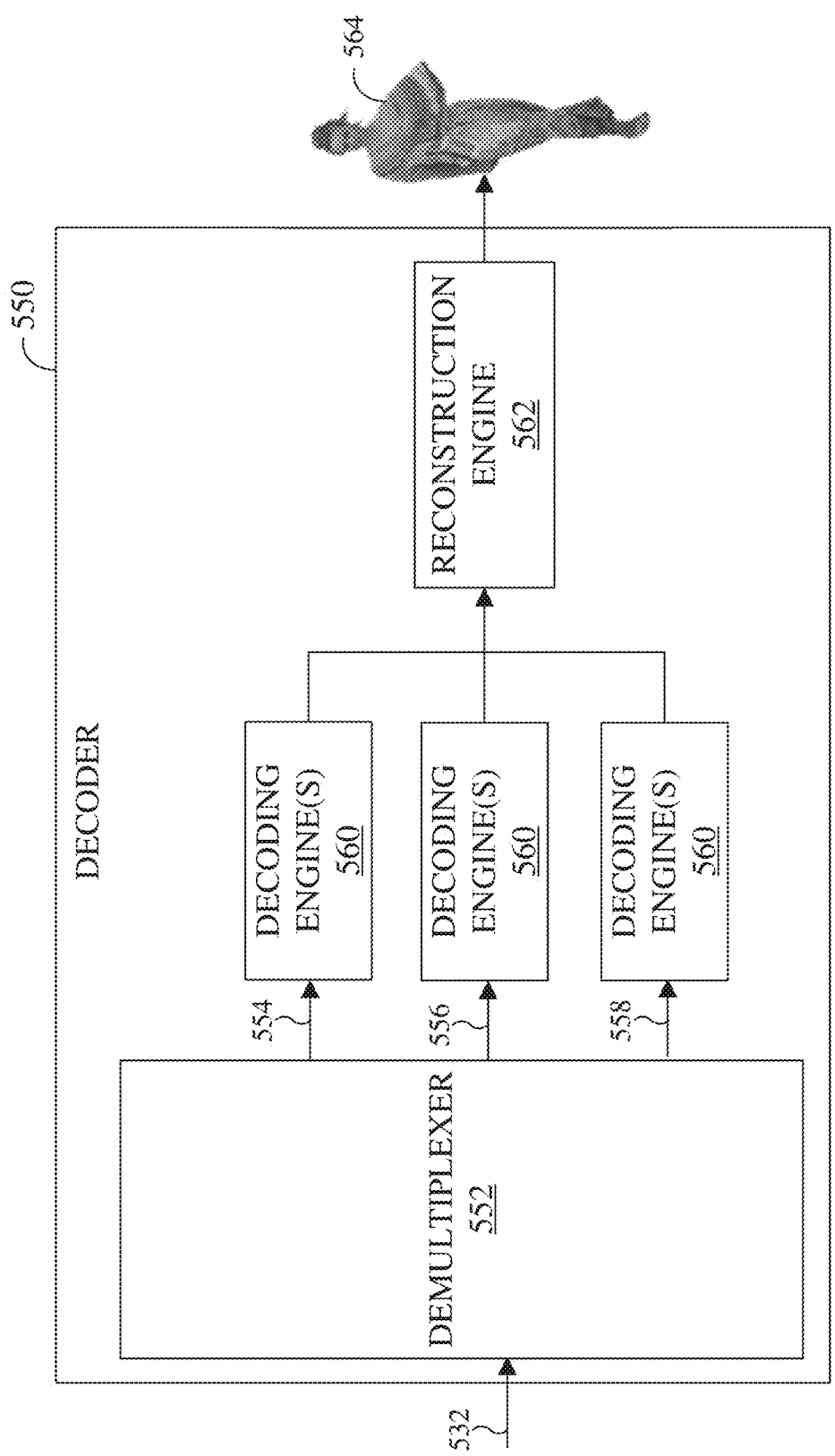
FIG. 5C illustrates an example block diagram of a decoder in accordance with an embodiment of this disclosure.
Figure 5D:
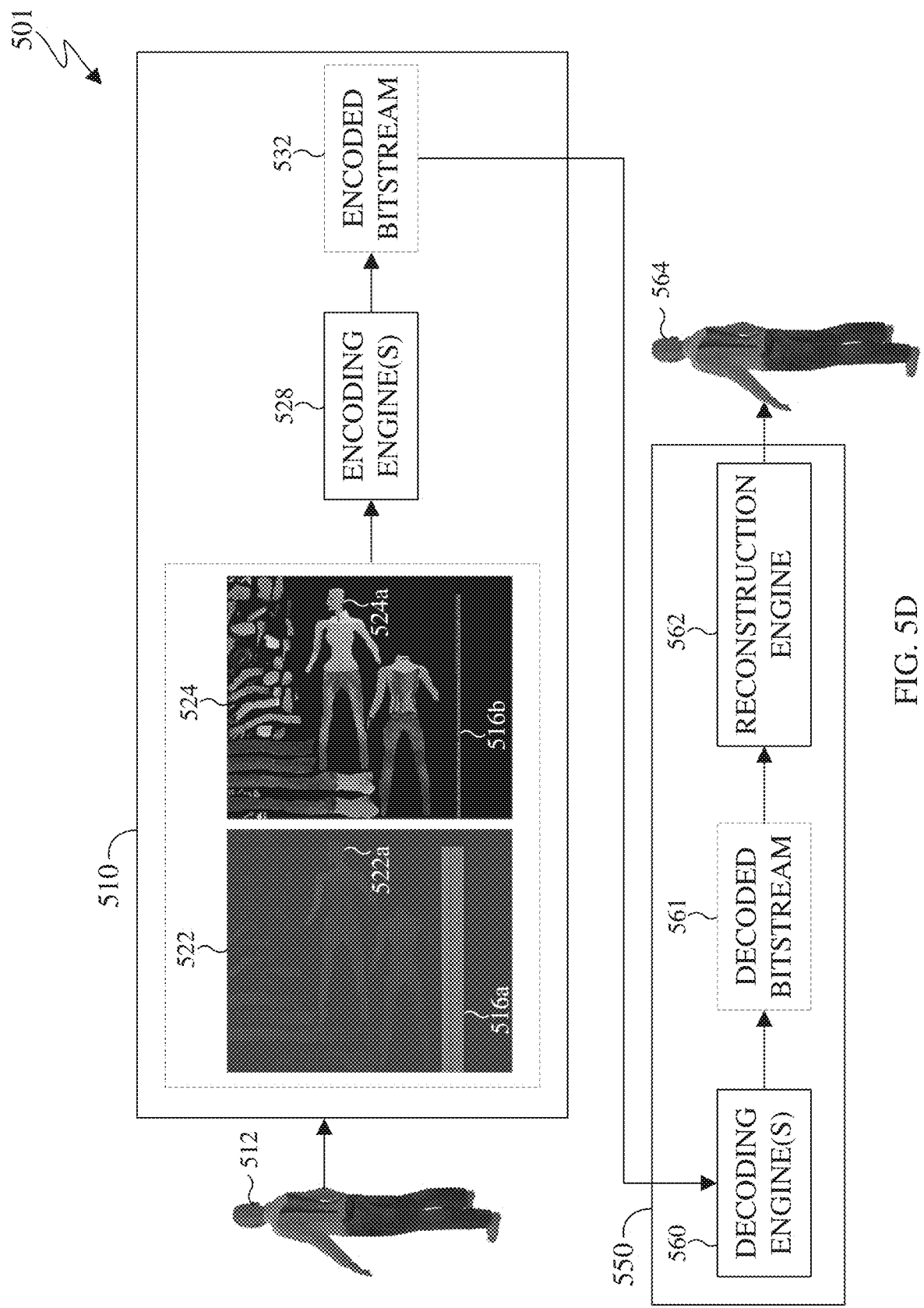
FIG. 5D illustrates a process of deconstructing, transmitting and reconstructing a point cloud in accordance with an embodiment of this disclosure.

FIG. 5A illustrates a block diagram of an example environment-architecture 500 in accordance with an embodiment of this disclosure. As shown in FIG. 5A, the example environment-architecture 500 includes an encoder 510 and a decoder 550 in communication over a network 502. FIG. 5B illustrates an example block diagram of the encoder 510 of FIG. 5A in accordance with an embodiment of this disclosure. FIG. 5C illustrates an example block diagram of the decoder 550 of FIG. 5A in accordance with an embodiment of this disclosure. FIG. 5D illustrates and example process of deconstructing, transmitting, and reconstructing a point cloud, using the encoder 510 and the decoder 550 as illustrated in the environment-architecture 500. The embodiments of FIGS. 5A, 5B, 5C, and 5D are for illustration only. Other embodiments can be used without departing from the scope of this disclosure.

The network 502 can be the same as or similar to the network 102 of FIG. 1. In certain embodiments, the network 502 represents a "cloud" of computers interconnected by one or more networks, where the network is a computing system utilizing clustered computers and components that act as a single pool of seamless resources when accessed. Also, in certain embodiments, the network 502 is connected with one or more servers (such as the server 104 of FIG. 1, the server 200), one or more electronic devices (such as the client devices 106-116 of FIG. 1, the electronic device 300), the encoder 510, and the decoder 550. Further, in certain embodiments, the network 502 can be connected to an information repository (not shown) that contains a VR and AR media content that can be encoded by the encoder 510, decoded by the decoder 550, or rendered and displayed on an electronic device.

In certain embodiments, the encoder 510 and the decoder 550 can represent the server 104, one of the client devices 106-116 of FIG. 1, the server 200 of FIG. 2, the electronic device 300 of FIG. 3, or another suitable device. In certain embodiments, the encoder 510 and the decoder 550 can be a "cloud" of computers interconnected by one or more networks, where each is a computing system utilizing clustered computers and components to act as a single pool of seamless resources when accessed through the network 502. In some embodiments, a portion of the components included in the encoder 510 or the decoder 550 can be included in different devices, such as multiple servers 104 or 200, multiple client devices 106-116, or other combination of different devices. In certain embodiments, the encoder 510 is operably connected to an electronic device or a server while the decoder 550 is operably connected to an electronic device. In certain embodiments, the encoder 510 and the decoder 550 are the same device or operably connected to the same device.

The encoder 510 is described with more below in FIG. 5B. Generally, the encoder 510 receive 3D media content, such as a point cloud, from another device such as a server (similar to the server 104 of FIG. 1, the server 200 of FIG. 2) or an information repository (such as a database). In certain embodiments, the encoder 510 can receive media content from multiple cameras and stitch the content together to generate a 3D scene that includes one or more point clouds.

In certain embodiments, the encoder 510 projects a point cloud into two dimensions which create patches that represent the projection. The encoder 510 clusters points of a point cloud into groups which are projected onto different planes such as an XY plane, an YZ plane, and an XZ plane. Each cluster of points is represented by a patch when projected onto a plane. The encoder 510 can project a point cloud into two dimensions. The encoder 510 packs the cluster of points or patches representing the point cloud onto 2D video frames. After the points of the point cloud are projected onto a 2D frame, the points are referred to as pixels or points interchangeably.

The encoder 510 can identify a set of points (denoted as missed points) that are not projected from the 3D point cloud to a 2D frame. The encoder 510 can also identify a portion or subset of the points of the missed points that is present would likely prevent cracks and holes. Thereafter, the encoder 510 then stores the coordinates of the subset of missed points in one or more additional points patches in the geometry frame and in each texture frame. In certain embodiments, the additional points patch is encoded using a different QP than the regular patches.

The encoder 510 transmits frames representing the point cloud as an encoded bitstream. The bitstream can be transmitted to an information repository (such as a database) or an electronic device that includes a decoder (such as the decoder 550), or the decoder 550 itself through the network 502. The encoder 510 is described in greater detail below in FIG. 5B.

The decoder 550 can receive a bitstream that represents media content, such as a point cloud. The bitstreams can include data representing a 3D point cloud. In certain embodiments, the decoder 550 can decode the bitstream and generate multiple frames, where the frames include regular patches and an additional points patch. The decoded frames can represent different attributes of a point cloud, such as geometry and texture. The decoder 550 can also reconstruct the point cloud from multiple frames. For example, when reconstructing the point cloud, the decoder 550 uses the data that is retrieved from the regular patches as well as the data included in the additional points patch. The decoder 550 is described with more below in FIG. 5C.

FIG. 5B illustrates the encoder 510 that generates a bitstream 532 that includes data representing a received 3D point cloud 512. The bitstream 532 which can include multiple bitstreams and can be transmitted via the network 502 of FIG. 5A to another device, such as the decoder 550. The encoder 510 detects points that are not included in the frames and generates an additional points patch that represents a portion of the missed points. The portion of the missed points can include none, some, or all of the detected missed points. The encoder 510 includes a patch generator 514, an additional points patch 516, a missed points selector 518, a frame packing 520, various frames (such as one or more geometry frames 522, one or more texture frames 524, and one or more occupancy map frames 526), one or more encoding engines 528 and a multiplexer 530.

The point cloud 512 can be stored in memory (not shown) or received from another electronic device (not shown). The point cloud 512 can be a single 3D object, or a grouping of 3D objects. The point cloud 512 can be stationary object or an object which moves. The point cloud 512 can be a 3D mesh similar to the mesh 410 of FIG. 4A.

The patch generator 514 generates patches by projecting a point cloud 512 onto a 2D surface, or frame. The patch generator 514 can use using two or more projection planes to generate the patches. In certain embodiments, the patch generator 514 splits geometry attribute and each texture attribute of each point of the point cloud 512. The geometry attribute and each texture attribute are eventually packed into respective geometry frames 522 or the texture frames 524. For each input point cloud, such as the point cloud 512, the geometry attribute and one or more texture attributes (such as color) are clustered using one or more criteria. The criteria include a normal direction, a distance to projected frames, contiguity, and the like. After the points are clustered, the geometry attribute and a corresponding texture attribute for each point are projected onto planes, such as the XY plane, the YZ plane, or the XZ plane. When projected, each cluster of points appears as patch. Each cluster of points can represent an attribute of the point cloud 512, such that for a given cluster of points, a patch (also referred to as a regular patch) represents a particular attribute of the point cloud. For example, a single cluster of points can be represented as multiple patches, where each patch represents a different attribute. It is noted that patches representing different attributes of the same cluster of points include a correspondence or a mapping, such a pixel in one patch corresponds to the same pixel in another patch.

The cluster of points can be from different layers or surface thicknesses of the 3D point cloud. For example, a first cluster of points can be from a first projection plane that is tangential to the outermost point of the point cloud and another cluster of points can be from a second projection plan that is a predefined distance from the first projection plane. As such, the first and second clusters of points can each have multiple patches representing the different attributes of the point cloud.

Missed points, also referred to as additional points, includes all or a portion of the points that were not projected via the patch generator 514. That is, the missed points include points that were not projected from the 3D point cloud onto a frame. The additional points patch 516 represents one or more patches that stores data representing a subset of the missed points. The additional points patch 516 is different than the regular patches which are generated by the patch generator 514. For example, the regular patches, representing a geometry attribute of the point cloud 512, store only the depth (minus an offset depth) of the projected points, while the additional points patch 516 directly stores the geometric coordinate values (X, Y, and Z) and texture values associated with all or some of the missed points.

The additional points patch 516 includes points that are not projected from the 3D point cloud into a patch. For an additional points patch 516 in a geometry frame 522, there is a corresponding additional points patch 516 located in each texture frame 524. For example, an additional points patch 516 representing geometry includes the three geometric coordinate values (X value, Y, value, and Z value) associated with each missing point. Correspondingly, an additional points patch 516 representing texture, including texture information, such as color (R value, G value, and B value) associated with each missing point. Each pixel or point in the additional points patch 516 representing geometry, has a corresponding pixel or point in the additional points patch 516 representing texture.

In certain embodiments, the data representing a geometry of the missed points are directly stored within the additional points patch 516. In certain embodiments, instead of directly storing the geometry values associated with the missed points in the additional points patch 516, a derivative geometry value can be stored. A derivative geometry value can include me form of residual values such as DPCM, sample-wise differences, and the like. Similarly, instead of directly storing the texture values associated with the missed points in an additional points patch 516, a derivative texture values can be stored. A derivative texture value can include some form of residual values, or sample-wise differences, DPCM and the like. Using a derived value, both for geometry and texture, the dynamic range of is smaller as compared to the original values.

The 3D points in an additional points patch 516 can be further clustered based on their coordinates. For example, 3D points that have two out of the three coordinates in common are clustered together. Then, for each cluster, only one point is stored in the respective additional-points-patch. For the remaining points in each cluster, a n-bit code is generated based the third (uncommon) axis. Then, the n-bit code is saved for each of these points, instead of the storing the three coordinates. This way, the size of the additional-points-patch is reduced. The value of "n" is the bit-depth of the geometry video frames.

The missed points selector 518 identifies missed points and selects a subset of the missed points to be included in the additional points patch 516. In certain embodiments, missed points selector 518 selects, all missed points which are grouped and stored in one or more additional points patches 516. In certain embodiments, missed points selector 518 selects none of the missed points, such that no additional points patches 516 are generated. In certain embodiments, the missed points selector 518 selects a portion of the missed points to be included in the additional points patch 516.

When selecting a portion of the missed points to be included in the additional points patch 516, the missed points selector 518 can identify a quantity of points within a predefined 3D zone surrounding a selected missed point. The size of the zone can be predefined or provided by a user.

In certain embodiments, the missed points selector 518 identifies missed points after the patch generator 514 generating the regular patches. The missed points selector 518 can identify missed points by segmenting and projection the 3D points from the point cloud 512 where a space partitioning data structure that is constructed from the projected 3D points. The space partitioning data structure is similar to a 3D KD tree. For every 3D point in the point cloud 512, a nearest neighbor search is initiated in the space partitioning data structure. If a point with the exact 3D geometry location as the query point is not found in the space partitioning data structure, the query point from the source point cloud is identified as a missed point. FIGS. 6A, 6B, 7A, and 7B below illustrate the missed points selector 518 identifying and selecting certain missed points of the point cloud to be included in the additional points patch 516.

The missed points selector 518 can identify the distance between a selected missed point and all of the other missed points within the zone. The distance can be based on a proximity parameter, which indicates the attribute that is being measured. The proximity parameter can be based on a geometric distance between two points. For example, the proximity parameter can measure the physical distance that separates the selected missed point and each of the other missed points within the zone. The proximity parameter can be based on a difference in texture between the selected missed point and each of the other missed points within the zone. For example, the missed points selector 518 identifies the color (or any other attribute) of the selected missed point, and then compares the color of the selected missed point to the color of each of the missed points within the zone. The difference in color between the selected missed point and each of the other missed points within the zone corresponds to the distance.

The missed points selector 518 can derive a relationship, based on the proximity parameter between the selected missed point and each of the other missed points within the zone. The relationship indicates a density score between points. For example, for a zone of a given size, points are considered more dense when more points are included in the zone and points are considered less dense when less points are included in the zone. Stated differently, the closer the points are together, the more dense the points are which represents a stronger relationship. Whereas the further points are from each other, the less dense the points are which represents a weaker relationship. The relationship rewards points that are within a first distance and penalizes points that are within a second distance, where the first distance is smaller than the second distance. When a certain number of points are within the first distance, as compared to when the same number of points are within the second distance (and the second distance is larger than the first distance), indicates that the points are more densely populated. For example, when there are three missed points within the particular zone, one of the missed points can be selected. The missed points selector 518 compares the distance between the selected missed point and the other two points. The missed points selector 518 determines that a stronger relationship exists (based on a higher density score) between the selected missed point and one of the two points when the distance (based on the proximity parameter) between the selected missed point is closer to one of the two points. When one of the missed points is closer to the selected missed point as compared to the other point, can indicate that the relationship between the selected point and the one point that is closer to the selected point is larger than the relationship between the selected point and the point that is further away. The relationship can be based on an inverse of the distance between the selected missed point and each of the points within the zone. When the quantity of points sounding the selected missed point is greater than a threshold and based on the relationship, the selected missed point is included in the additional points patch 516.

The missed points selector 518 can exclude certain missed points, such that the data of the missed points is not included in the additional points patch 516. Missed points can be excluded based on the relationship or the quantity of neighboring points, such that the excluded points. For example, if the missed points selector 518 determines that a missed point is isolated, then the isolated missed point is excluded from the additional points patch 516. A point is determined to be isolated when the point is not in close proximity with any other group of closely clustered miss points, in the 3D space. The proximity of a point to other points in its vicinity can be based on the geometric distance, such as the 3D Euclidean distance of the point from the others points in its neighborhood. The proximity can alternatively be based in terms of closeness of the attribute, such as color, of a point with respect to the attribute of other points in its vicinity. The proximity can be based on a combination of closeness in both geometry and attribute space of a point to other points in its vicinity.

In certain embodiments, the missed points selector 518 includes missed points that can form a group of points in the additional points patch 516. The group of points includes points that are within a specified zone and are connected or part of one or more connected components based on the proximity parameter, the relationship, and the quantity of points within the zone. For example, seed point, which is not part of any group is selected. Then, depending on a criterion, adjacent points to the seed point are added to the group or ignored. As each new point is added, the group of points increases. The missed points selector 518 can perform several iterations to generate a group of points based on the proximity parameter, the relationship.

The proximity parameter can be based on Euclidean distance in 3D space a color distance, or both Euclidean distance and color distance. For example, if the proximity parameter is based on Euclidean distance in 3D space, then a 3D point can be included in the group of points if the Euclidean distance between that point and any other point already in the group is less than a specified value. In another example, if the proximity parameter is based on the proximity of points in color space (or any other texture), then the group of points is proximity of the points based on color. After constructing a group of points, the missed points selector 518 includes the group of points in the additional points patch 516 when number of points in the group of points is greater than a threshold.

In certain embodiments, the missed points selector 518 derives a relationship between points, when selecting a subset of missed points to include in the additional points patch 516. The relationship is defined by a neighborhood score. The neighborhood score can represent the density of points within a given area or zone. The neighborhood score for a given missed point can be based on the distances (the proximity parameter) of adjacent points from the given missed point within a particular zone. The neighborhood score for a given missed point can be based the number of adjacent points from the given missed point. The neighborhood score for a given missed point can be based on both the distances and the number of neighbors from the point of interest. That is, the neighborhood score can be based on the Euclidean distance (e.g. a sphere surrounding the candidate point), a maximum number of points criteria, or a combination thereof.

In certain embodiments, the neighborhood score yields the relationship that penalizes points that are more isolated and rewards points that are close to other points in 3D space. Points are more isolated when the points are surrounded by fewer neighbors. For example, when the neighborhood score is a function of both the distances and the number of neighbors from the point of interest, neighborhood score penalize points that are more isolated and reward points that are close to other points in 3D space. Equation (1) below describes the neighborhood score $$neighborhoodScore[p] = \sum_{i=1}^{n} \frac{1}{d_i} \qquad \text{Equation (1)}$$

Equation (1) describes deriving a neighborhood score for a point, p. In Equation (1) the variable n includes $n \in \{0, 1, 2, \ldots, N\}$ represents the total number of neighbors of the point p in 3D space within a certain radius (distance), N is the maximum number of neighbor count to consider for computing the neighborhood score, and $d_i$ is the distance of the $i^{th}$ neighbor from the point. Only those missed points whose neighborhood score is greater than a threshold score are stored in the additional points patches, where the threshold score can be provided as input to the encoder by a user. In certain embodiments, the 3D neighbors of a point and their distances is found by organizing the identified missed points in a space-partitioning data structure, such as a 3-dimensional KD tree and searching for neighbors using a range search or nearest neighborhood search. Equation (1) is described further in FIGS. 7A and 7B.

An example syntax is provided below to illustrate deriving a neighborhood score. In Syntax (1), the maximum neighbor count, N, is 16. The maximum radius or distance (represented by the term 'maxDist' is set to 10. In certain embodiments, the maximum neighbor count and the maximum radius or distance can be fixed parameters of the Syntax (1). In other embodiments, the maximum neighbor count and the maximum radius or distance can be specified by the user based on the type and quality of the input point cloud.

The sum of inverse distances is normalized by the maximum neighbor count. The term 'minNormSumOfInvDist4MPSelection_' represents the user provided threshold score that is typically between 0 and 1. For example, the 'minNormSumOfInvDist4MPSelection_' is set to 0, then all identified missed points are stored in the additional-points-patches. When the 'minNormSumOfInvDist4MPSelection_' is set to 1, then none of the identified missed points are stored in the additional-points-patches. Therefore, when the number of missed points that is included in the additional points patches is based on the value assigned to the term 'minNormSumOfInvDist4MPSelection_.' The term 'missedPoints' represents a vector that initially stores the identified missed points. Syntax (1) includes a KD tree is constructed from the identified missed points and nearest-neighborhood search to find neighbors and their distances for every point.

```
Syntax                                                         (1)
size_t numMissedPts = missedPoints.size( );
if (params_.lossyMissedPointsPatch_){
    // Settings for selecting/pruning of additional points
    const size_t maxNeighborCount = 16;
    const size t maxDist = 10;
    const double minSumOfInvDist4MissedPointsSelection =
                 params_.minNormSumOfInvDist4MPSelection_ *
                 maxNeighborCount;
    std::vector<size_t> tmpMissedPoints;
    tmpMissedPoints.resize(0);
    PCCPointSet3 missedPointsSet;
    missedPointsSet.resize(numMissedPts);
    // create missed points cloud
    for (size_t i = 0; i < numMissedPts; ++i) {
        missedPointsSet[i] = source[missedPoints[i]];
    }
    PCCStaticKdTree3 kdtreeMissedPointsSet;
    kdtreeMissedPointsSet.build(missedPointsSet);
    double sumOfInverseDist = 0.0;
    // iterate over all points and assign neighborhood score
    for (size_t i = 0; i < numMissedPts; ++i) {
        PCCPointDistInfo nNeighbor[maxNeighborCount];
        PCCNNResult result = { nNeighbor, 0 };
        PCCNNQuery3 query = { PCCVector3D(0.0), maxDist,
           maxNeighborCount };
        query.point = missedPointsSet[i];
        kdtreeMissedPointsSet.findNearestNeighbors(query, result);
        sumOfInverseDist = 0.0;
        for (size_t j = 1; j < result.resultCount; ++j) {
            sumOfInverseDist += 1 / result.neighbors[j].dist2;
        }
        if (sumOfInverseDist >=
           minSumOfInvDist4MissedPointsSelection) {
            tmpMissedPoints.push_back(missedPoints[i]);
        }
    }
    // store the selected points into the missedPoints vector
    numMissedPts = tmpMissedPoints.size( );
    missedPoints.resize(numMissedPts);
    missedPoints = tmpMissedPoints;
}
```

In certain embodiments, points that are highly likely to be missed and that are likely candidates for preventing holes are identified before the 3D point cloud is projected from 3D state onto 2D frames. For example, the missed points selector 518 can identify certain regions on the 3D surface of the point cloud 512 and a subset of points from these regions can be stored in the additional points patch (instead of identifying the missed points (following projection) and identifying the subset of points to store in the additional points patch based on a suitable proximity score). The missed points selector 518 identifies certain regions that are highly likely to generate a significant number of missed points leading to cracks and holes. The missed points selector 518 identifies these regions based on the nature the normal vectors of the collection of points in the region. For example, a high variance in the direction of the normal vectors in the local region could indicate regions that could generate a large number of missed points. Furthermore, the properties of local surface regions that correlates with high number of missed points during 3D-to-2D projection can be learned, for example using an appropriate machine learning algorithm. Once learned, the algorithm can be used to identify the points that are highly like to be missed and are highly likely to prevent cracks and holes. After identifying the points, the missed points selector 518 can include these points in the additional points patch 516.

In certain embodiments, the missed points selector 518 includes only missed points that are within a 3D regions-of-interests (ROIs) in the additional-points-patch 516. In certain embodiments, the missed points selector 518 includes points within an ROI regardless of whether the points are identified as missed points. The ROIs may be pre-specified, using some form of metadata. For example, one or more 3D ROIs can be specified by the creator of the point clouds (content creator) to label important regions in the 3D point cloud for coding and rendering those regions for higher quality relative to the other regions on the point cloud. Alternatively, the ROIs may be or automatically generated at the encoder. For example, one or more 3D ROIs can be generated based on automatic detection of important regions in the point cloud; such as regions belonging to the face in a humanoid shaped point cloud. For instance, a machine learning algorithm or a deep learning algorithm trained to recognize models human faces can identify and segment the regions of the point cloud belonging to human faces. In certain embodiments, only the missed points originating from these regions are encoded using the additional-points-patch 516. In other embodiments, a ROI patch is generated, in addition to the additional points patch 516, and includes all of the points included in the ROI.

The missed points selector 518 can select certain points within an ROI to be included in an ROI patch, similarly to how the missed points selector 518 selects missed points to be included in the additional points patch 516. For example, the missed points selector 518 first identifies that the point cloud 512 includes at least one ROI. For each ROI, the missed points selector 518 identifies the set of points of the point cloud 512 that are within an ROI. For each point, the missed points selector 518 identifies a quantity of points that are within a predefined zone. The predefined zone can be the size of the ROI. The predefined zone can be a portion of the ROI, such that multiple predefined zones exist within the ROI. The missed points selector 518 identifies a distance, based on the proximity parameter, between a respective point within the zone and the other points within the zone. The missed points selector 518 then derives a relationship (similar to the neighborhood score) between the respective point within the zone and the other points within the zone. The missed points selector 518 includes points in an ROI patch when the quantity of points surrounding the respective point is larger than a threshold, or the relationship between the respective point and the points within the zone, or a combination thereof.

In certain embodiments, the missed points selector 518 either randomly or in an orderly fashion selects a subset of the missed points, to satisfy certain size and position criterion of the additional points-patches 516. The size criterion is defined as the width and height while the certain position criterion is a position within one of the geometry frames 522 or the texture frames 524. In particular, the sizes and positions of the additional points patch 516 are determined such that the additional points patch 518 can fit into a minimum number of tiles (or any such special regions) in a particular frame. The tiles are coded using a different QP value than the rest of the frame.

In certain embodiment, the missed points selector 518 selects missed points, to be included in the additional points patch based on one or more criterion. The missed points selector 518 selects missed points based on the ability to form closely clustered groups in 3D space. Additionally or alternatively, the missed points selector 518 selects missed points based on points belonging to specified ROI. Additionally or alternatively, the missed points selector 518 selects missed points based the size of the additional-points-patch, such that the one or more additional-points-patches can be fit into a minimum number of tiles in the video frame.

The frame packing 520 packs and stores the patches generated by the patch generator 514. For example, the patch generator 514 projects 3D points create patches. The patches that represent the geometry information and are packed stored in the geometry video frames, such as the geometry frames 522. Subsequently, patches for other attributes such as color are generated and packed in the respective attribute video frames, such as the texture frames 524. There is a correspondence (or a mapping) between the patches in the geometry frames and the patches in the one or more attribute frames. For example, if the pixel location (i, j) within a patch in the geometry video frame stores the geometry information (such as depth) of the kth point in the point cloud, then the color of the kth point is stored at pixel location (i, j) the associated texture frame.

The frame packing 520 organizes the patches by attribute, such as geometry, color and other types of texture such as reflectiveness, material, and the like. Geometry (such as the geometry frames 522) represent is the geographic location of each point of the point cloud 512. Texture (such as the texture frames 524) represents a single aspect of each point of the point cloud 512, such as color. Each geometry frame 420 has at least one corresponding texture frame 422. For example, if the geometry frame 522 indicates where each point of the point cloud 512 is in 3D space, then the corresponding texture frame 524 can indicate the color of each corresponding point. In certain embodiments, additional frames can be created that represent the other attributes or textures. For example, if another set of frames are generated, such as reflectance frames (not shown) then the corresponding reflectance frame indicates the level of reflectance of each corresponding point within a corresponding geometry frame 522 and a corresponding texture frame 526.

The frame packing 520 sorts and packs the patches (both the geometry and texture patches) into respective frames, such as the geometry frames 522 and the texture frames 524. In addition to sorting and packing patches of a similar attribute into similar frames, the frame packing 520 packs patches from the same surface thickness into similar frames. For example, for any given frame, the frame can include patches that represent one attribute of the point cloud 512, from the same layer. For instance, each of the geometry frames 522 includes patches of points that represent the geometry of the point cloud 512 from a single surface thickness, whereas each of the texture frames 524 include patches of points that represent the texture of the point cloud 512 from a single surface thickness. In certain embodiments, frame packing 520 generates one or more occupancy map frames 526 based on the placement of the patches (both regular patches and the additional points patch 516) within the geometry frames 522 and the texture frames 524.

When the size of a frame (such as the geometry frames 522 and the texture frames 524) is constant across an entire sequence, the efficiency of the encoding engines 528 is increased. In certain embodiments, the frame packing 520 sets the size of the frames (such as the geometry frame 522 and the texture frame 524) or a GOF. The size of each frame can be dependent on the number and size of the patches. In certain embodiments, the frame packing 520 identifies the maximum width and the maximum height of all of the frames. Instead of signaling the width and height for a group of frames in a 'group_of_frames_header( ),' the width and height can be signaled in the 'bitstream_header( ).' Syntax (2), illustrates an example syntax where the width and height of a frame is signaled in the bitstream header, instead of a group of frames header.

```
Syntax                                              (2)
Bitstream_header( ) {
    PCC_category2_container_magic_number
    PCC_category2_container_version
    Frame_width
    Frame_ eight
```

In certain embodiments, instead of signaling the width and height of frames in the bitstream header, a normative bitstream constraint is included in the bitstream. For example, a normative bitstream constraint, can ensure that the size of the video frames is constant throughout the point cloud sequence. In other embodiments, if the size of a geometry frame 522 and texture frame 524 exceed the signaled frame size, the entire point cloud frame is sent directly as depth and texture frames, using all three components. In such a case, no occupancy map and patch and projection related auxiliary information needs to be signaled.

In certain embodiments, a flag can be signaled to indicate whether the data associated with the additional point (also referred to as missed points) is included in the bitstream as auxiliary information. The flag can be titled 'additional_point_data_present_flag,' as used in Syntax (3) below. When the flag value is one, data associated with the missed points is sent as auxiliary information, and the number of additional points is signaled. After signaling the flag, the bitdepth for positions (x,y,z) and texture. In certain embodiments, the bitdepths can be signaled at the sequence or group of frames levels. If the bitdepths are signaled at the sequence or group of frames levels, them the actual geometric position and texture of the points are signaled. For example, first all of the geometric x values are send, then all of the geometric y values are sent followed by the geometric z values. Once the geometric z values are sent, the texture components are sent. For example, if the texture attribute is color (such as R,G,B or Y,U,V), the Y values for all the points followed by the U values for all of the points followed by the V values are for all of the points are transmitted. In certain embodiments, it is possible for a decoder (such as the decoder 550) to predict a future point based on the previous sample and code the prediction error with a variable length code to reduce the number of bits needed. The values are coded, via the encoding engines 528 using a fixed length where the length is the bitdepth for position or texture. The geometry and texture values can be quantized using a uniform quantization. Syntax (3) below illustrates using a flag to indicate the additional points (also referred to as missed points) are sent as auxiliary information.

```
Syntax                                                              (3)
frame_auxiliary_information( ) {
    bit_count_v1
    bit_count_d1
    additional_point_data_present_flag
    if (additional_point_data_present_flag) {
        num_additional_points
        bitdepth_position
        bitdepth_texture
        for ( i = 0; i < num_additional_points; i++ ) {
            additional_points_position[0][i]
            additional_points_position[1][i]
            additional_points_position[2][i]
            additional_points_texture[0][i]
            additional_points_texture[1][i]
            additional_points_texture[2][i]
        }
    }
    occupancy_aux_stream_size
    ByteCount += 15
}
```

In certain embodiments, if the flag is one, the point positions can be interleaved. Interleaving the point positions can presented as x0, y0, z0, Y0, U0, V0, x1, y1, z1, Y1, U1, V1, until all of the points are transmitted.

In certain embodiments, instead of sending the missed points as auxiliary information, all of the points in the point cloud frame can be sent without the creation of patches, via the patch generator 514. For example, width and height of a frame can be chosen such that the frame multiplied by the height is greater than half of the number of points in any point cloud frame. If a flag, indicating direct coding, is signaled at the beginning of the frame auxiliary information, then the number of points in the point cloud frame is signaled. Thereafter a geometry frame of a first depth is filled in a raster scan. The component 0 can represent the x coordinate, the component 1 can represent the y coordinate, and the component 2 can represent the z coordinate. After generating the geometry frame, a texture frame is generated. A texture attribute of each point is then directly coded similar to the geometry attribute. When direct coding is implemented, the occupancy map and other auxiliary information is not signaled. It is noted that the flag indicating whether the point cloud is directly coded or whether patches are generated representing the point cloud is sent before any other data corresponding to the frames.

In certain embodiments, frame packing 520 generates the occupancy map. A value of zero in the occupancy map at a pixel of a frame (such as the geometry frame 522 and the texture frames 524) indicates that the corresponding depth values and texture values are to be ignored by the decoder 550 when reconstructing the point cloud. In certain embodiments, the encoder 510 can assign any values for pixels associated with a zero in the occupancy map, in order to minimize the bit-rate. A non-zero value, such as one, in the occupancy map at a particular row and column indicates that the corresponding depth values are valid and to be used by the decoder 550 when reconstructing the point cloud.

The frame packing 520 sorts and packs the patches (both the regular geometry patches, the regular texture patches, an additional points patch 516 representing geometry, and an additional points patch 516 representing texture) into respective frames, such as the geometry frames 522 and the texture frames 524. That is, the geometry coordinates of all or a subset of the 3D points in the point cloud 512 that were missed during the 3D to 2D projection are identified, grouped, and stored in the one or more additional points patches 516.

In certain embodiments, the geometry and the texture values stored in different the additional-points-patches 516 can be sorted based on a metric. The metric can increase the correlation between neighboring values. Various metrics can be used for the sorting. For example, the 3D points are sorted based on their proximity in 3D space. For another example, the points are sorted based on their proximity with respect to a particular texture, such as color.

In certain embodiments, the additional points patch 516 representing geometry can be stored in one of the geometry frames 522 with the regular patches or in a separate geometry frame 522. Similarly, the additional points patch 516 representing a particular texture can be stored in one of the corresponding texture frames 524. For example, if there is only one texture, such as color, that is associated with each point, then an additional points patch 516 representing color is included in the texture frames 524 by the frame packing 520. In another example, if there are two textures such as color and reflectiveness, then two additional points patches 516 are generated, one additional points patch 516 representing color and included in a set of texture frames 524 representing color, a second additional points patch 516 representing the reflectiveness and included in a second set of texture frames 524 representing a reflection.

The additional points patch 516 can be packed (via the frame packing 520) besides the regular patches in a corresponding frame. In certain embodiments, the additional points patches 516, representing different attributes, are packed in their own frame. For example, multiple a new frames can be generated representing different attributes and include the additional points patches 516 within the newly generated frames. In certain embodiments, an additional frame can be generated which includes multiple additional points patches 516 representing each attribute of the point cloud 512.

In certain embodiments, instead of putting the additional points patch 516 with the regular patches in the same video frame, the frame packing 520 places the additional points patch 516 in one or more separate video frames (for both geometry and texture information). That is, the additional points patches 516 are embedded in one or more video frames that do not include the regular patches. When one or more separate video frames used to store the additional points patches 516, the one or more separate video frames can be coded with a different quality than the video frames used for coding the regular patches, by the encoding engines 528. For example, the video frames used for additional points patch 516 is coded using lower QP values yielding a higher quality, than the video frames (such as the geometry frames 522 and the texture frames 524) that are used for the regular patches.

In certain embodiments, the geometry frame can be represented by multiple frames. For example, one frame represents all of the X coordinate values, a second frame represents all of the Y coordinate values, and a third frame represents all of the Z coordinate values. For example, the additional points patch 516 can be represented by multiple patches, with each patch corresponding to a single coordinate value and included within each respective frame. In another example, the additional points patch 516 can be included in any of the multiple frames. That is, when multiple frames are used to represent a single attribute, such as geometry, the additional points patch 516 representing geometry can be included in any of the multiple frames. In yet another example, an entirely new frame can be generated for storing the additional points patch 516.

The geometry frames 522 include pixels representing the geometry of the point cloud 512. The geometry frames 522 can include regular patches, an additional points patch (similar to the additional points patch 516), or both the regular patches and the additional points patch. Similarly, the texture frames 524 include pixels representing the texture of the point cloud 512. The texture frames 524 can include regular patches, an additional points patch (similar to the additional points patch 516), or both the regular patches and the additional points patch.

The occupancy map frames 526 represent occupancy maps that indicate the valid pixel locations in the frames (such as the geometry frames 522 and the texture frames 524). The valid pixels are the actual points of the point cloud 512 which are projected into patches (via the patch generator 514) and packed into respective frames (via the frame packing 520). For example, the occupancy map frames 526 indicate whether a point in a frame is a valid pixel or an invalid pixel. A valid point on the occupancy map indicates a pixel on the 2D frame that corresponds to a 3D point in the point cloud. Conversely, an invalid point on the occupancy map indicates an invalid pixel on the 2D frame. An invalid pixel does not correspond to a point of the point cloud 512. In certain embodiments, one of the occupancy map frames 526 correspond to both a geometry frame 522 and a texture frames 524.

The geometry frames 522, the texture frames 524, and the occupancy map frames 526 are encoded via the encoding engine 528. In certain embodiments, the frames (such as the geometry frames 522, the texture frames 524, and the occupancy map frames 526) are encoded by independent encoders. For example, one encoding engine 528 can encode the geometry frames 522, another encoding engine 528 can encode the texture frames 524, and yet another encoding engine 528 can encode the occupancy map frames 526. In certain embodiments, the encoding engine 528 can be configured to support an 8-bit, a 10-bit, a 12-bit, a 14-bit, or a 16-bit, precision of data. The encoding engine 528 can be a video or image codec such as HEVC, AVC, VP9, VP8, JVNET, and the like to compress the 2D frames representing the 3D point cloud.

In certain embodiments, the additional-points-patches 516 that are stored in the video frames (such as the geometry frames 522 and the texture frames 524) are compressed using the same compression quality, in terms of QP and bitrate, as the regular patches. In other embodiments, different values of QP are used for encoding the additional-points-patches 516 as compared to the regular patches in the video frames (such as the geometry frames 522 and the texture frames 524). For example, the ability to change the QP value within a frame is available in both H.264/AVC and in HEVC video codecs. For instance, H.264/AVC allows for the QP value of coded picture frames to be changed at a macroblock level, while HEVC allows the QP value to change at a quantization group (QG) level, where the QG size is a multiple of the coding unit (CU) size which can from 8×8 to 64×64 depending on the size of the coding tree unit (CTU). When the encoding engines 528 use H.264/AVC to encode the frames (such as the geometry frames 522 and the texture frames 524) then, the additional-points-patch 516 are positioned in the video frame at pixel locations which are integer multiples of the macroblock size (along both directions). When the encoding engines 528 uses HEVC to encode the frames (such as the geometry frames 522 and the texture frames 524) then, the additional-points-patch 516 are positioned in the video frame at pixel locations which are multiples of the CTU size.

In certain embodiments, the QP value used for encoding the additional points patch 516 representing geometry is lower than the QP value used for encoding the regular patches in the geometry frame 522. Stated differently, the QP value used for encoding the regular patches in the geometry frame 522 is larger (or higher) than the QP value used for encoding the additional points patch 516 representing geometry in the geometry frame 522. Such that the additional points patch 516 representing geometry in the geometry frame 522, with the lower QP yields a higher quality as compared to the regular patches within the geometry frame 522. However, the QP value used for encoding the additional points patch 516 representing texture is the same as the QP value that is used to encode the regular patches in the texture frame 524. That is, the QP value that is used for encoding both the regular patches in the texture frame 524 and the additional points patch 516 representing texture in the texture frame 524 is the same. In certain embodiments, the QP value representing both the regular and additional points patch within the texture frame 524 can be larger, smaller or the same as the QP value used for encoding the regular patches in the geometry frame 522. In other embodiments, the QP value representing both the regular and additional points patch within the texture frame 524 can be larger, smaller or the same as the QP value used for encoding the additional points patch 516 representing geometry in the geometry frame 522.

Different QP values are used for the additional points patch 516 and the regular patches within the geometry frames 522 as compared to the additional points patch 516 and the regular patches within texture frames.

In certain embodiments, additional-points-patch 516, a patch including the points from an ROI, or both can be included into one or more special regions or tiles in each of the video frames, such as the geometry frame 522 and the texture frame 524. By including the additional-points-patch 516, and/or a patch including the points from an ROI, the patches can be coded using a lower QP to attain higher quality or to facilitate content-aware compression.

The values within an additional points patch 516 representing geometry can be scaled to change the dynamic range of the geometry information. If the values within the additional points patch 516 are scaled, then the geometry information, in the one or more additional-points-patches are losslessly encoded. The decoder 550 can rescale the geometry information within the additional points patch 516. For example, the geometry values are scaled by diving by 2 at the encoder, and multiplying by 2 at the decoder. Furthermore, the texture information in the corresponding additional-points-patches can either be lossless or lossy coded.

In certain embodiments, when the encoding engines 528 perform lossy compression, if the maximum depth values stored in the regular patches is n-bit, and the coordinate values stored in the additional points patch 516 in the one or more geometry frames 522 is m-bits, then the depth values in the regular patches are scaled by a factor of $2^{(m-n)}$. The decoder 550 rescales the depth values back to n-bit values before reconstructing the point cloud from the decoded bitstream. For example, if the geometry video bit-depth and the geometry coordinates of the point cloud is 10 bits, but only 8-bit are used to represent the depth values in the regular patches, then the depth values in the regular patches are scaled by a factor of 4 by left-shifting twice. Based on the previous example, the depth values of the points in the regular patches, after retrieving from the decoded bitstream, are scaled back by right-shifting twice, which in effect, divides the values by 4. Scaling in such a manner preserves the fidelity of the original n-bit values against the quantization losses during lossy compression.

The encoding engines 528 can encode the geometry frames 522 (including the additional points patch 516 representing geometry) losslessly and encode the texture frames 524 (including the additional points patch 516 representing texture) in a lossy fashion. Encoding the geometry frames 522 losslessly provides the geometry information with maximum fidelity.

The multiplexer 530 combines the multiple frames (such as the geometry frames 522, the texture frames 524, and the occupancy map frames 526) which are encoded, to create a bitstream 532. The multiplexer 530 is also able to combine the other information that instructs the decoder 530 as to how to perform interpolate and generate the multiple frames from a single interleaved frame.

FIG. 5C illustrates the decoder 550 that includes a demultiplexer 552, one or more decoding engines 560, and a reconstruction engine 562. The decoder 550 decompresses the compressed bitstream into decoded geometry, attribute, occupancy map video frames, along with auxiliary information.

The decoder 550 receives a bitstream 532, such as the bitstream that was generated by the encoder 510. The demultiplexer 552 separates bitstream 532 into one or more bitstreams representing the different frames. For example, the demultiplexer 552 separates various streams of data such as the geometry frame information 554 (originally the geometry frames 522 of FIG. 5B), texture frame information 556 (originally the texture frames 524 of FIG. 5B), and the occupancy map information 558 (originally the occupancy map frames 526 of FIG. 5B).

As discussed above, while the regular patches in the geometry frames store only the depth information of the points, the additional points patch 516 associate with a geometry frame 554 store all the three coordinates—x, y, z—for each point. Therefore, the decoder 550 identifies the kind of patch before it can reconstruct the point cloud. In certain embodiment, one or more specific positions in the list of patches is fixed for the additional points patches. For example, the last or the first patch in the list of patches (information present in the auxiliary patch information data), is reserved for the additional points patch 516. In such a case, it may be required to signal to the decoder about the presence or absence of the one or more additional points patches 516. The signaling is done using one or more flags that are sent to the decoder in the encoded bitstream (typically once or at the sequence level). In another example, a flag that is part of the patch header information (patch metadata) associated with each patch, can indicate whether the patch is a regular patch or an additional points patch 516. In this example there is no restriction on the number and position of additional points patches 516 and there is no need to signal the presence or absence of additional-points-patches in the bitstream.

The decoding engines 560 decode the geometry frame information 554, the texture frame information 556, and the occupancy map information 558. In certain embodiments, a single decoding engine 560 decodes the geometry frame information 554, the texture frame information 456, and the occupancy map information 558. After decoding the geometry frame information 554, the texture frame information 556, and the occupancy map information 558, multiple video frames representing the geometry and texture of the 3D point cloud as well as the and occupancy map frames are represented. The geometry frame information 554, the texture frame information 556, and the occupancy map information 558, include the additional points patch 516.

The reconstruction engine 562 generates a reconstructed point cloud 564 by reconstructing the decoded geometry frame information 554, the decoded texture frame information 556, and the decoded occupancy map information 558. The reconstructed point cloud 564 is similar to the point cloud 512. Reconstruction engine 562 uses the information from the additional points patches 516, representing each texture, to fill in the artifacts, such as holes and cracks increasing the visual quality of the reconstructed point cloud 564. By using data representing the missed points that is included in the additional points patch 516, the reconstructed point cloud 564 should be substantially similar to the point cloud 512.

FIG. 5D illustrates a process 501 of deconstructing, transmitting and reconstructing a point cloud in accordance with an embodiment of this disclosure. The process 501 uses the encoder 510 and the decoder 550 as illustrated in the environment-architecture 500. The process 501 is a high level overview of embodiments of the present disclosure. The process 501 is for illustration only. Other embodiments can be used without departing from the scope of the present disclosure.

The encoder 510 receives the point cloud 512. The point cloud 512 can be generated, created, received, by the encoder or another device, such as an electronic device. An electronic device, according to embodiments of the present disclosure, can include personal computers (such as a laptop, a desktop), a workstation, a server, a television, an appliance, and the like. An electronic device can also include one or more cameras that are configured to capture an object to create a point cloud. Additionally, the electronic device can be at least one of a part of a piece of furniture or building/structure, an electronic board, an electronic signature receiving device, a projector, or a measurement device. In certain embodiments, the electronic device can be a portable electronic device such as a portable communication device (such as a smartphone or mobile phone), a laptop, a tablet, an electronic book reader (such as an e-reader), a personal digital assistants (PDAs), a portable multimedia player (PMPs), a MP3 player, a mobile medical device, a virtual reality headset, a portable game console, a camera, and a wearable device, among others. The electronic device is one or a combination of the above-listed devices. Additionally, the electronic device as disclosed herein is not limited to the above-listed devices, and can include new electronic devices depending on the development of technology.

The point cloud 512 is decomposed into multiple frames, such as a geometry frame 522 and a texture frame 524. The geometry frame 522 and the texture frame 524 include many patches, such as patch 522a and patch 524a, respectively. Each patch, such as patch 522a is generated by clustering points of the point cloud 512, representing the cluster of points by a particular attribute (in this case geometry), and projecting the clusters onto the frames (such as the geometry frame 522). The patches 522a and 524a can be referred to as a regular patches. The regular patches are sorted and packed into separate frames where each frame represents an attribute such as the geometry frame 522 and the texture frame 524.

The additional points patch 516a and an additional points patch 516b represent a missed points patch representing geometry and a points patch representing texture, respectively. In certain embodiments, the missed points included in the additional points patches 516a and 516b can be identified by reconstructing a point cloud (in the encoder based on the projected patches that are included in the at least two frames 522 and 524) and comparing the reconstructed point cloud against the inputted point cloud 512 to find the missed points. In certain embodiments, the missed points can be detected using a KD tree nearest neighborhood search. When missed points are identified, the missed points are grouped together to form one or more additional points patches 516a and 516b. In particular, the geometric coordinates are used to generate the additional points patch 516a, and the texture associated with each point is used to generate the additional points patch 516b. In certain embodiments, the additional points patch is non-structured, as depicted by the additional points patches 516a and 516b.

In certain embodiments, the additional points patch 516a and an additional points patch 516b are included in the geometry frame and the texture frame, respectively, as shown in FIG. 5D. In other embodiments, the additional points patch 516a and an additional points patch 516b are included in separate frames. The method 600 of FIGS. 6A and 6B describe whether the additional points patches 516a and 516b are stored in the corresponding frames with the regular patches or in separate frames.

Figure 7A:
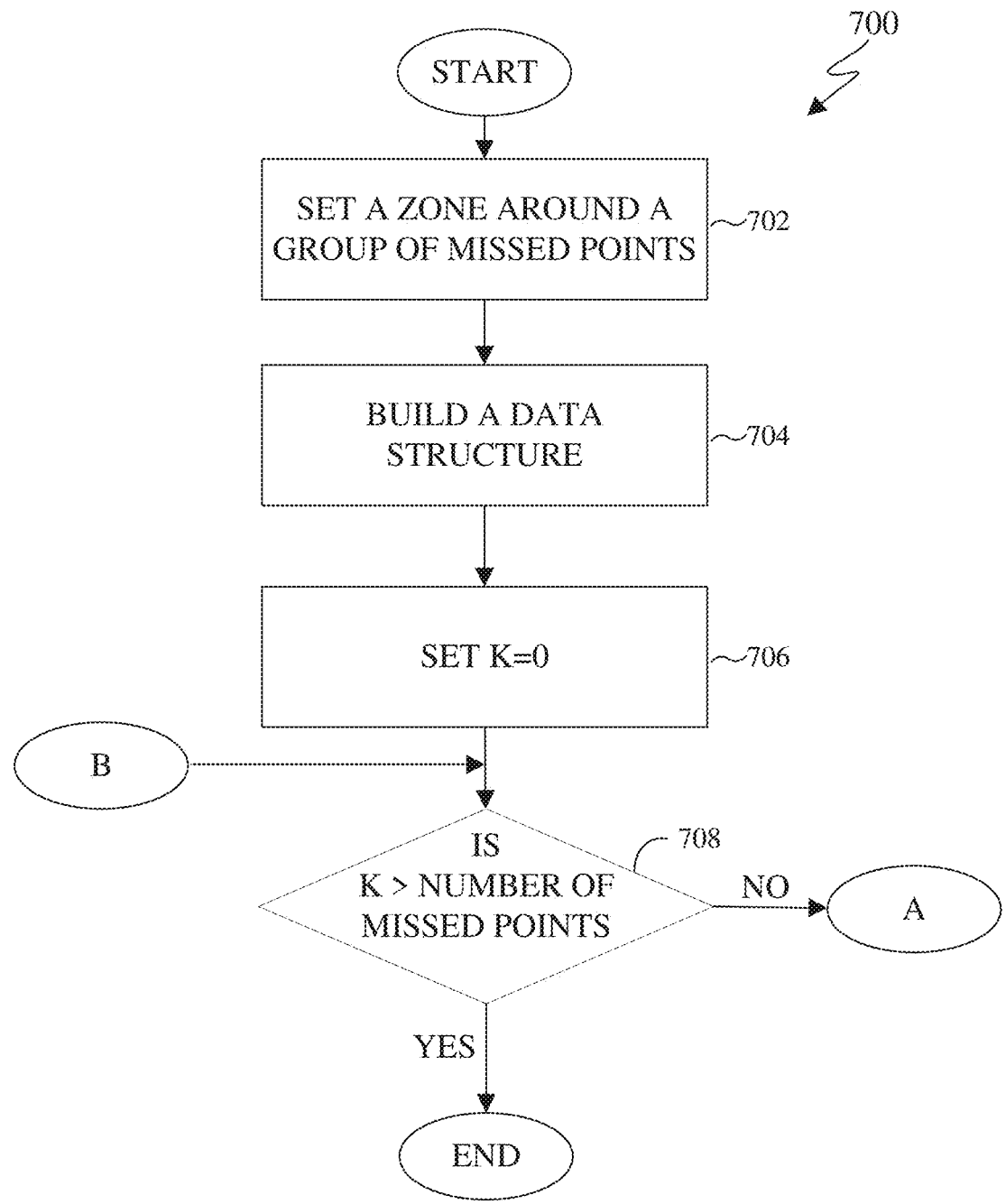
FIGS. 7A and 7B illustrate an example method for selecting points from the set of identified missed points to be included in an additional points patch in accordance with an embodiment of this disclosure.
Figure 7B:
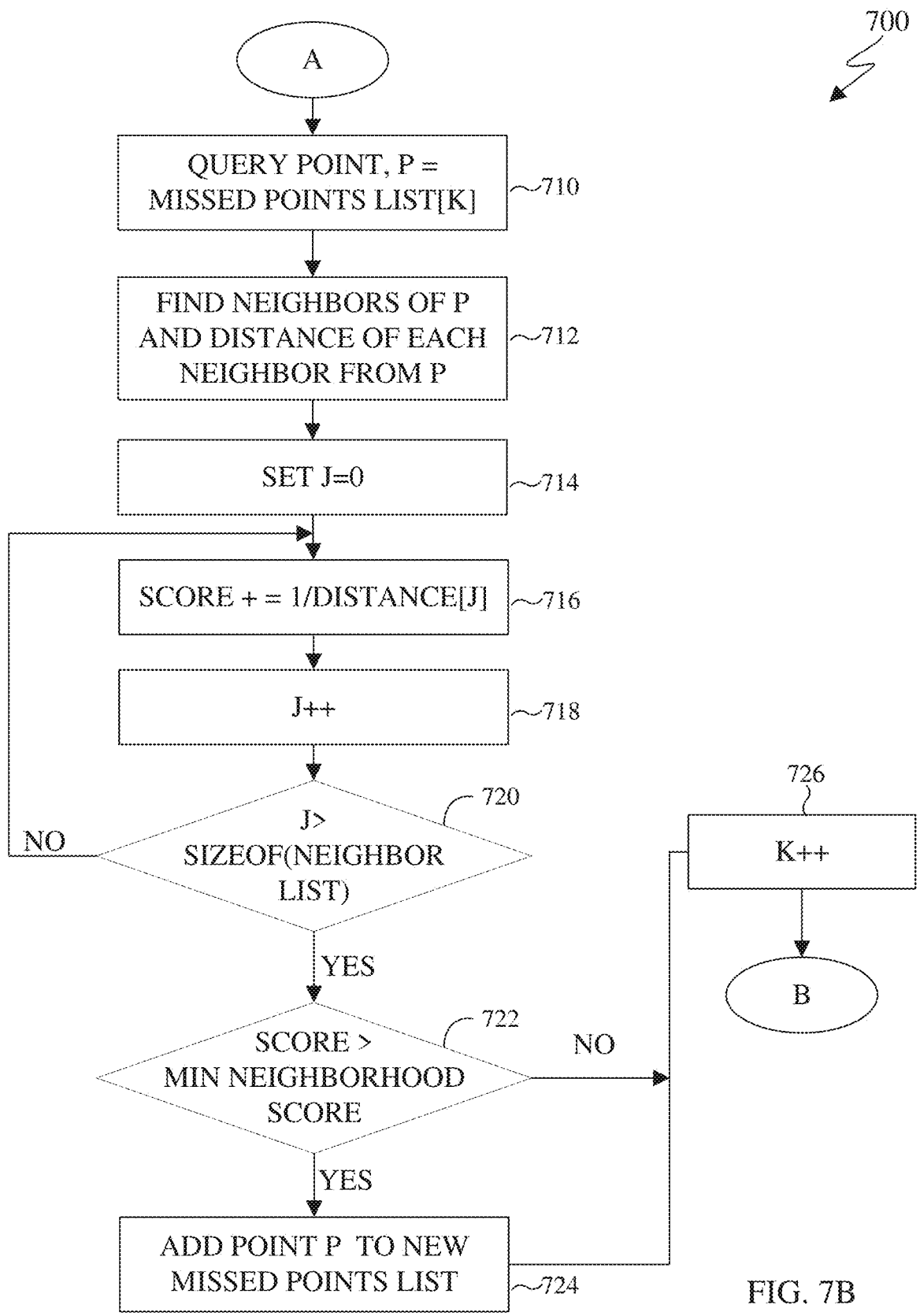

The additional points patches 516a and 516b can include all of the identified missed points or a subset of the missed points. In certain embodiments, all of the identified missed points are included in the additional points patches 516a and 516b. In other embodiments a subset or a portion of the identified missed points are included in the additional points patches 516a and 516b. Storing a subset of the identified missed points in a additional points patch (such as the additional points patches 516a and 516b) reduces the number of points included in the respective additional points patches. Reducing the number of missed points in the additional points patch 516 reduces the size of the additional points patch, which can increase the Bjøntegaard Delta Bit Rate (BDBR), as compared to a scenario when all of the identified missed points are included in a additional points patch. The BDBR is a performance metric used to evaluate lossy coding performance, by averaging bit-rate savings of one codec over another for the same visual. Determining whether to add a missed point to a additional points patch is based on 3D neighborhood information around each identified missed point. In certain embodiments, the neighborhood information includes how many other points are in the vicinity of a given point. The neighborhood information can also indicate how dense the neighborhood is around the given point. FIGS. 7A and 7B, illustrates a method for selecting certain missed points to be included in the additional points patch.

When the frames are generated, the encoding engines 528 compress the frames to generate the encoded bitstream 532. The encoding engines 528 can be a video codec such as HEVC, AVC, VP9, VP8 JVET, and the like. The encoded bitstream 532 is transmitted from the encoder 510 to the decoder 550.

The decoder 550 can be a user equipment, such as a HMD 116 of FIG. 1. The encoded bitstream 532 is decompressed by decoding engines 560, to generate decoded bitstream 561. Thereafter, the reconstruction engine 562 reconstructs and renders the point cloud 564. The reconstructed point cloud 564 is a reconstructed representation of the point cloud 512 on different device.

Although FIG. 5A illustrate the environment-architecture 500, FIG. 5B illustrates the encoder 510, FIG. 5C illustrates the decoder 550, and FIG. 5D illustrates a process of using the encoder 510 and the decoder 550 various changes can be made to FIGS. 5A, 5B, 5C, and 4D. For example, any number of encoders or decoders can be included environment-architecture 500.

Figure 6A:
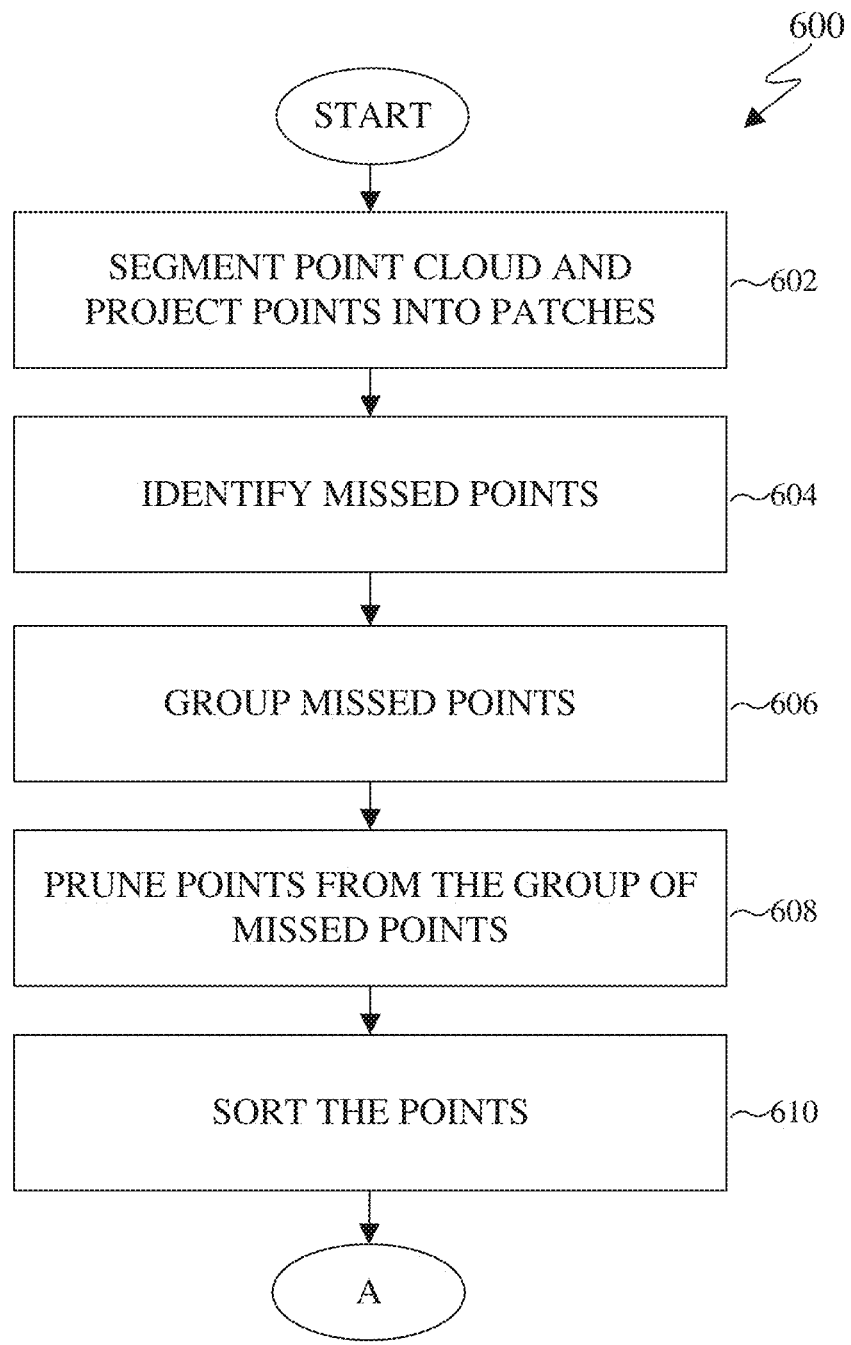
FIGS. 6A and 6B illustrate an example method for identifying and storing missed points by an encoder in accordance with an embodiment of this disclosure.
Figure 6B:
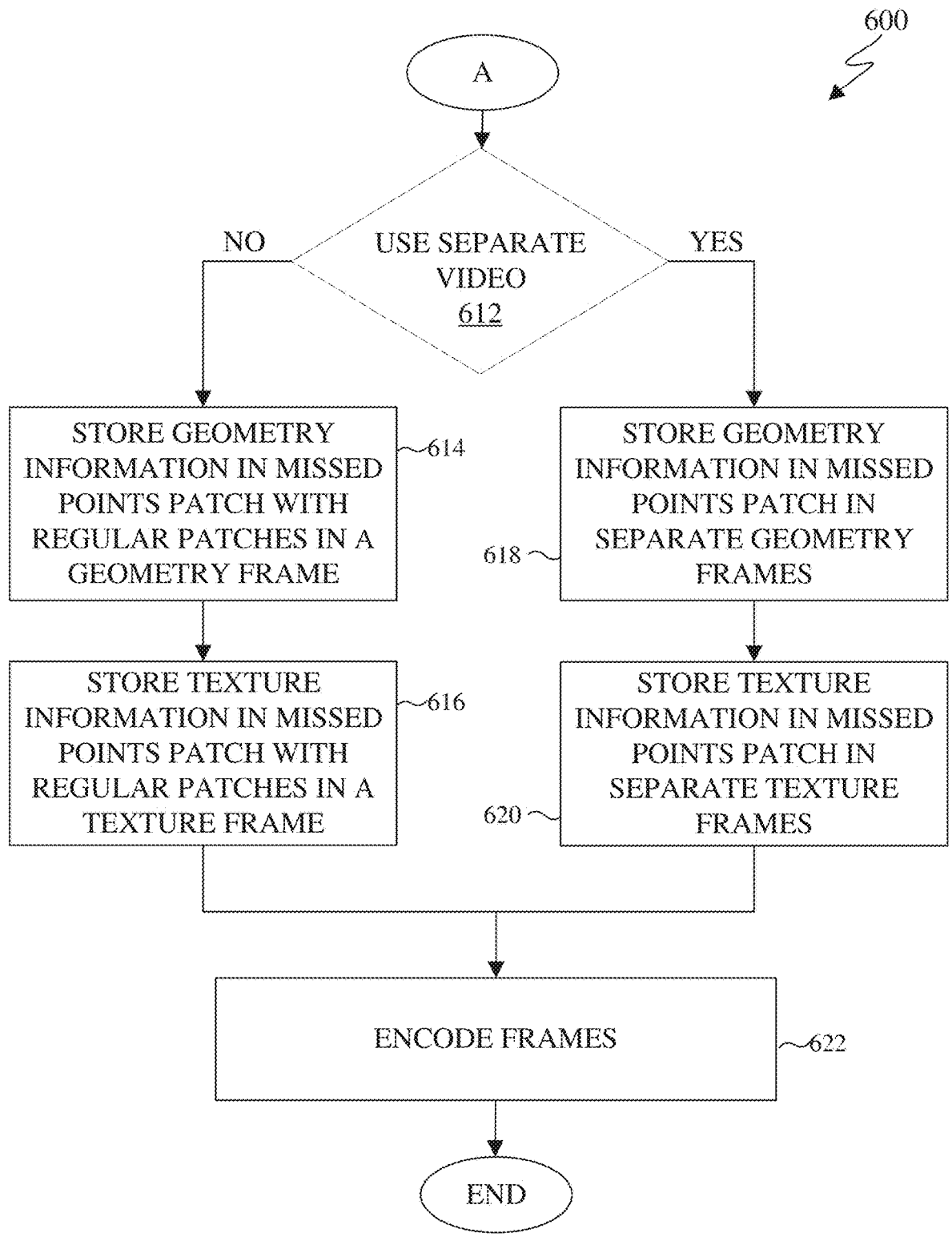

FIGS. 6A and 6B illustrate an example method 600 for identifying and storing missed points by an encoder in accordance with an embodiment of this disclosure. The method 600 illustrates the missed points selector 518 identifying and storing the missed points using the one or more additional point patches 516, and the encoding engines 528 encoding the generated frames including the missed point patches. The method 600 can be performed by the server 104 or any of the client devices 106-116 of FIG. 1, the server 200 of FIG. 2, the electronic device 300 of FIG. 3, the encoder 510 of FIGS. 5A and 5B, or any other suitable device or system. For ease of explanation, the method 600 is described as being performed by the encoder 510 of FIGS. 5A and 5B.

The method 600 illustrates that storing the additional point patch 516 representing geometry in either the same geometry frames 522 besides the regular geometry patches or in a separate geometry frame 522. Similarly, the one or more corresponding additional point patch 516 representing a texture can be stored in either the same texture frames 524 along with the regular attribute patches or in a separate texture frame 524.

In step 602, encoder 510 segments the point cloud 512 into clusters of points and projects the clusters of points onto frames. The projected clusters of points are regular patches, where each patch represents an attribute of the point cloud. Patches that correspond to different attributes are on different frames.

In step 604, encoder 510, via the missed points selector 518, identifies missed points. In certain embodiments, the missed points can be identified by utilizing a space partitioning data structure. The space partitioning data structure includes the points that are projected from the 3D point cloud to the frames. The encoder 510 inspects each point in the point cloud 512 to find a match of each point within the space partitioning data structure. Each point of the point cloud 512 that is not included in the space partitioning data structure is identified as a missing point. Thereafter, in step 606, the identified missing points are grouped into a list of missing points.

In step 608, the encoder 510 prunes the points in the list of missing points. For example, the missed points selector 518 selects certain points to include in the additional points patch. That is, certain points from the list of missing points can be removed or overlooked based on a proximity criteria. The proximity criteria measures how close the other missed points are from a given missed point. FIGS. 7A and 7B, described below, illustrate selecting points from a set of identified missed points to be included in the additional points patch. In certain embodiments, the extent of the pruning is controlled by a predefined parameter. The predefined criteria can be user specified. In certain embodiments, the step 608 is omitted from the method 600.

In step 610, the encoder 510 sorts the missed points. After pruning the list of missed points, the encoder 510 sorts the missed points sorted based on geometry, a texture, or a combination thereof. Sorting the missed points before storing the missed points into missed point patches increases the correlation between neighboring points in the additional points patches. Increasing the correlation between neighboring points improves both inter and intra prediction (to some extent) during video coding and results in lower bitrates. In certain embodiments, the step 610 is omitted from the method 600.

It is noted that steps 608 (pruning the points) and 610 (sorting the points) are optional and can be omitted from the method 600. Steps 608 and 610 are based on a proximity or neighborhood criteria, where the proximity is a measure of how close the other missed point are from a given missed point. For example, all of the missed points can be included in the additional points patch, as such, there is no need to prune the list of missed points. For another example, none of the missed points can be included in the bitstream, as such there is no need to prune a blank list of missed points. Although steps 608 and 610 are optional, the step 608 removes the isolated points which are wasteful to store and do not add to improving the visual quality of the reconstructed point cloud. Similarly, the step 610 improves the local correlation between closely located points in the one or more additional points patch 516 resulting in improved video coding performance.

In step 612, the encoder 510 determines whether the additional point patches 516 are stored in the same frames as the regular patches or whether the missed point patches are stored in frames that are separate than the regular patches. In certain embodiments, the encoder 510 groups a portion of the identified missed points together into the additional points patch 516. For example, the additional point patch 516 can include multiple additional points patches. For example a first additional point patch 516 includes missed points representing geometry of the point cloud 512, while a second additional points patch 516 includes missed points representing a texture of the point cloud 512. If multiple textures are included in the point cloud 512 then the second additional points patch 516 includes missed points representing a first texture of the point cloud 512 and third additional points patch 516 includes missed points representing a second texture of the point cloud 512 and the like.

In step 614, the encoder 510 determines to store the missed points, representing geometry in a additional points patch, in the same frame as the regular patches representing geometry. The geometry values (X, Y, Z) of the points in the additional points patch are directly stored in the one or more color planes of the one or more geometry video frames. In certain embodiments, if the 4:2:0 video format is used for encoding the geometry videos, the additional points patch for the geometry is constructed by grouping all the x-coordinates, followed by the y-coordinates, followed by all the z-coordinates into a single patch in the Y color plane of the geometry video frame. Thereafter, in step 616, the missed points representing texture are stored in a additional points patch that is positioned with the regular patches in a corresponding texture frame.

In step 618, the encoder 510 determines (based on the step 612) to store the missed points, representing geometry in a additional points patch, located in a different frame than the regular patches representing geometry. In certain embodiments, if the 4:4:4 video format is used for encoding the geometry videos, then the x, y, and z coordinates could be distributed respectively, in the Y, U and V planes of the video frame. Thereafter, in step 620, the missed points representing texture are stored in a additional points patch that is positioned in texture frames. For example, if the texture is color, represented as an RGB tuple for every point, then the R, G, and B color information is distributed respectively in the R, G, B (or Y, U, V) color planes of the attribute video frames.

A mapping is generated between the geometry of the missed points stored in the additional points patch 516 in the geometry frame 522 and the texture information of the missed points stored in the additional points patch 516 in the texture frames 524. The regular patches and the additional points patch 516 are packed via the frame packing 520 into geometry frames 522 and the texture frames 524. For example, if the pixel location (i, j) within a patch in the geometry video frame stores the geometry information (such as depth) of the kth point in the point cloud, then the color of the kth point is stored at pixel location (i, j) the associated texture frame.

In step 622, the encoding engines 528 encode the geometry frames 522 and the texture frames 524. In certain embodiments, the encoding engines 528 use different quantization step sizes for the regular patches and the additional points patches.

Although FIGS. 6A and 6B illustrates one example of a method 600 for point identifying, sorting and encoding missed points, various changes may be made to FIGS. 6A and 6B. For example, while shown as a series of steps, various steps in FIGS. 6A and 6B could overlap, occur in parallel, or occur any number of times.

FIGS. 7A and 7B illustrate an example method 700 for selecting points from the set of identified missed points to be included in a additional points patch in accordance with an embodiment of this disclosure;

The method 700 illustrates deriving a neighborhood score which is used to select certain missed points, from a set of missed points, to be included in the additional points patch. The method 700 can be performed by the server 104 or any of the client devices 106-116 of FIG. 1, the server 200 of FIG. 2, the electronic device 300 of FIG. 3, the encoder 510 of FIGS. 5A and 5B, or any other suitable device or system. For ease of explanation, the method 700 is described as being performed by the missed points selector 518 of the encoder 510 of FIGS. 5A and 5B.

In step 702, the encoder 510 sets a zone in 3D space around one or more missed points. For example, after the encoder 510 identifies each missed point, the encoder 510 places a zone around the missed points. The size of the zone can be predetermined. Alternatively, the size of the zone can be based on a user input, such as an indicated level of detail. Based on the level of detail the size of the zone can increase or decrease. The size of the zone can be based on the number of missed points. For example, the size zone can change to include a certain number of missed points. The number of points within the zone can be based on a function of the size of the missed points list. That is, the NUM_OF_MISSED_PTS is set to equal SIZEOF(MISSED_POINTS_LIST).

In step 704, the encoder 510 builds a space partitioning dataset. The dataset can be a 3D KD tree using points in a missed points list. The dataset can use the points within the zone. After building a dataset for a grouping of points, the encoder 510 sets a variable k, to zero, in step 706.

In step 708, the encoder 510 determines whether the value of k is larger than the number of missed points within the zone. The number of missed points within the zone can be predefined or user defined. When k is larger than the number of missed points the method 700 is concludes, and the identified missed points are included in the additional points patch 516.

When the variable k, is less than the number of missed points, in step 710, a query point, identified as p, is selected from the list of points. The query point is a randomly selected missed point within the zone. In step 712, the encoder finds up to n neighbors of the selected point p, where n represents the maximum neighbor count. The encoder also derives the distances (both geometric and texture, based on the proximity parameter) between point p, and each of the n neighbors, using the nearest neighborhood search in the space partitioning data structure.

In step 714, the encoder 510 sets both the neighborhood score to zero and the variable j to zero. In step 716, the encoder 510 sets a score based on the inverse of the distance to j. In step 718, j is increased.

In step 720, the encoder 510 determines whether j is larger than the neighbors list. When J is not larger than the neighbors list, the method repeats step 716 and re-evaluates the score based on the increased value of j, and then increases the value of j in step 718 again. The method 700 repeats steps 716 and 718 until the size of j is larger than the neighbors list.

When the size of j is larger than the neighbors list, in step 722, the encoder 510 determines whether the score (as set in step 716) is larger than a preset minimum neighborhood score. When the score is larger than a preset minimum neighborhood score, point p, is added to the new missed points list, in step 724, thereafter the value of K is increased in step 726.

Alternatively, when the score is smaller than a preset minimum neighborhood score, the value of K is increased (step 726), but the point p is not included in the new missed points list. After increasing k, the encoder 510 repeats step 708 to determine whether the value of k is larger than the number of missed points within the zone.

Although FIGS. 7A and 7B illustrates one example of a method 700 for selecting certain missed points, various changes may be made to FIGS. 7A and 7B. For example, while shown as a series of steps, various steps in FIGS. 7A and 7B could overlap, occur in parallel, or occur any number of times.

Figure 8:
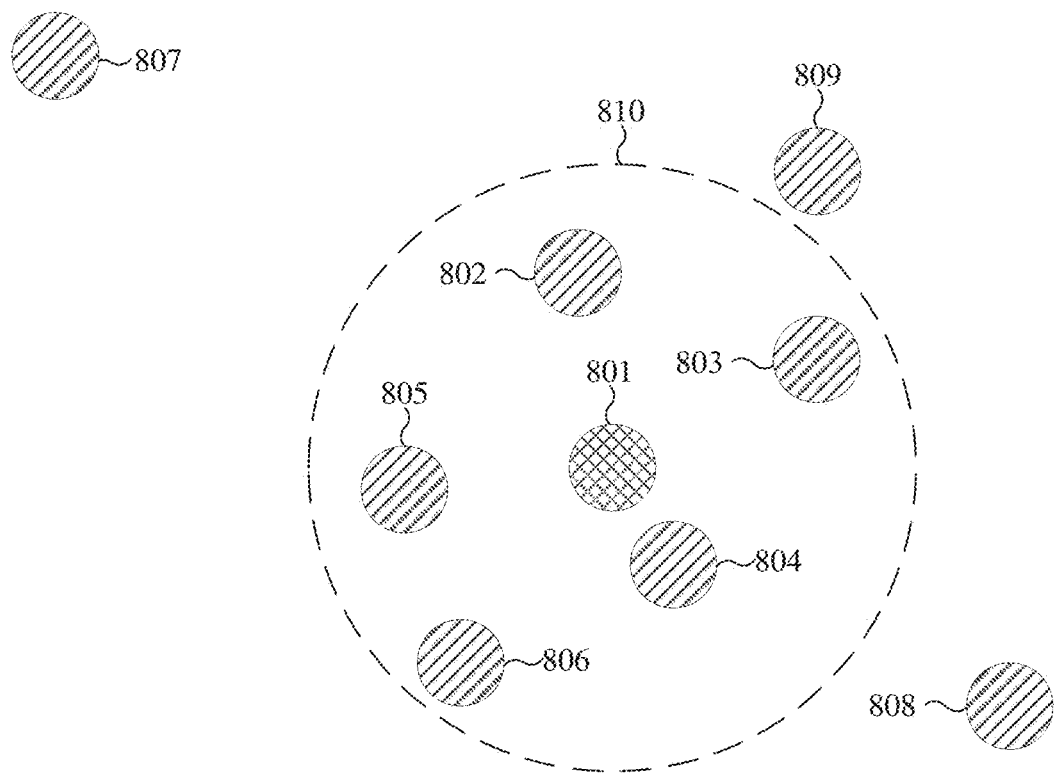
FIG. 8 illustrate example clusters of missed points in accordance with an embodiment of this disclosure.

FIG. 8 illustrate example clusters of missed points in accordance with an embodiment of this disclosure. The embodiment of the FIG. 8 is for illustration only and other embodiments could be used without departing from the scope of this disclosure.

FIG. 8 illustrates a zone 810 and a cluster of points such as point 801, point 802, point 803, point 804, point 805, point 806, point 807, point 808, and point 809. The zone 810 is centered around the point 801. In certain embodiments the zone is a predefined shape, such as a sphere, square, rectangle, or the like. In certain embodiments, the zone is amorphous and is not a particular shape. It is noted, that although the points of FIG. 8 are illustrated in two dimensions, the points can be arranged in three dimensions, similar to that of a point cloud.

The points 801-809 represent a grouping of points that are identified as missed points. The zone 810 includes only a portion of the points. In particular, the zone 810 includes point 801, point 802, point 803, point 804, point 805, and point 806, while point 807, point 808, and point 809 are outside of the zone. The size of the zone can be preset or user provided. When analyzes missed points to include in the additional points patch, the missed points selector 518 of FIG. 5B, ignores points that are outside of a particular zone. As such, point 807, point 808, and point 809 are not analyzed with respect to the particular zone around point 801. The missed points selector 518 identifies a quantity of points around the point 801. In this example, there are five points (point 802, point 803, point 804, point 805, and point 806), around the point 801. The missed points selector 518 identifies a distance (either geometric or a texture difference) based on a proximity parameter. Based on the distance, the missed points selector 518 derives a relationship which yields the neighborhood score. The missed points selector 518 includes the respective point, point 801, in the additional points patch, when the number of neighboring points (in this case, 5) is greater than a threshold, and based on the relationship between the point 801 and the points 802-806.

Although FIG. 8 illustrate example clusters of missed points various changes can be made to FIG. 8. For example, any number of points can be included, any of the points can be selected as the respective point, the size of the zone can change, and the like.

Figure 9:
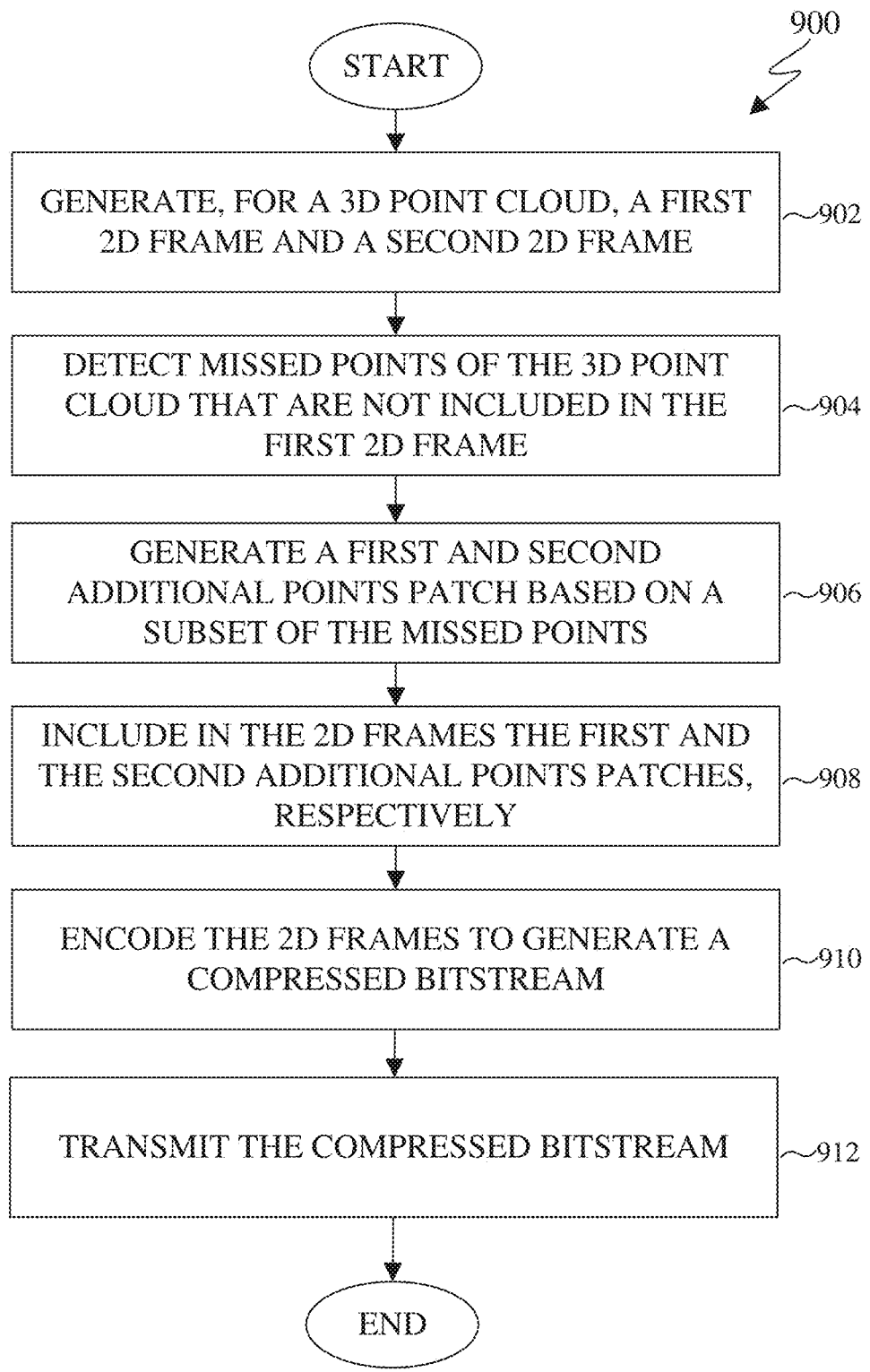
FIG. 9 illustrates an example method for encoding a point cloud in accordance with an embodiment of this disclosure.

FIG. 9 illustrates an example method for encoding a point cloud in accordance with an embodiment of this disclosure. The method 900 can be performed by the server 104 or any of the client devices 106-116 of FIG. 1, the server 200 of FIG. 2, the electronic device 300 of FIG. 3, the encoder 510 of FIGS. 5A, 5B, and 5D, or any other suitable device or system. For ease of explanation, the method 900 is described as being performed by the encoder 510 of FIGS. 5A, 5B, and 5D.

In step 902, the encoder 510 generates 2D frames for a 3D point cloud. The 2D frames include a first 2D frame and a second 2D frame. The 2D frame can represent different attributes, respectively, of the 3D point cloud. For example, the first 2D frame can represent geometry while the second 2D frame can represent a texture, such as color.

In step 904, the encoder 510 detects missed points of the 2D point cloud that are not included in any of the 2D frames. In certain embodiments, the encoder 510 detects points of the 3D point cloud that are not included in the 2D frame representing geometry. For example, the encoder 510 can reconstruct the geometry 3D point cloud, and compare the reconstructed geometry to the original point cloud to find each point that is missing.

In step 906, the encoder 510 generates additional points patches based on a subset of the missed points. The additional points patches can represent different attributes that correspond respectively to the first 2D frame and the second 2D frame. For example, for each of the missed points, the encoder 510 identifies a quantity of points within a predefined zone surrounding a respective point of the missed points. The encoder 510 can identify a distance, based on a proximity parameter, between the respective point and the points within the predefined zone. The proximity parameter is based on the first attribute, the second attribute, or both the first and second attributes.

The encoder 510 can derive a relationship between the respective point and the points within the predefined zone based on the distance. The relationship is based on the neighborhood score which combine the inverse of the distance between the respective point and each of the points within the predefined zone. The relationship rewards the points that are within a first distance and penalizes the points that are within a second distance, wherein the first distance is smaller than the second distance. A preset score can indicate a percentage of points of the missed points that are included in the additional points patches. When the score is a first level all of the missed points are included in the additional points patches. Alternatively, when the score is a second level, none of the missed points are included in the additional points patches. When the score is between the first level and the second level, a corresponding portion of the missed points are included in the first and second additional points patches. Based on the score, the encoder 510 can include the respective point in the subset of the missed point in the additional points patch, when the quantity of points surrounding the respective point is greater than a threshold, and the relationship between the respective point and the points within the predefined zone. In certain embodiments, the missed points that are represented in the additional points patch are sorted.

In step 908, the encoder 510 places the additional points patch that includes data representing geometry of the missed points into the into a 2D frame representing geometry. The encoder also places the additional points patch that includes data representing a texture of the missed points into the into a 2D frame representing the same texture.

In step 910, the encoder 510 then encodes the 2-D frames including the additional points patches to generate a compressed bitstream. The encoder 510 can apply different quantization parameter to the patches within the frames. For example, a first quantization parameter can be applied to the regular patches while a different quantization parameter can be applied to the additional points patches. For example, the QP value used for encoding the additional points patch for geometry, in a geometry frame, can be lower than the QP value used for encoding the regular patches in the same geometry frame, while the QP value used for encoding the additional points patch for other attributes, in a texture frame, can be the same for the regular attribute patches in the same texture frame. In step 912, the encoder 510 transmits the compressed bitstream. The compressed bitstream can be ultimately transmitted to a decoder, such as the decoder 550.

Although FIG. 9 illustrates one example of a method 900 for point encoding, various changes may be made to FIG. 9. For example, while shown as a series of steps, various steps in FIG. 9 could overlap, occur in parallel, or occur any number of times.

Figure 10:
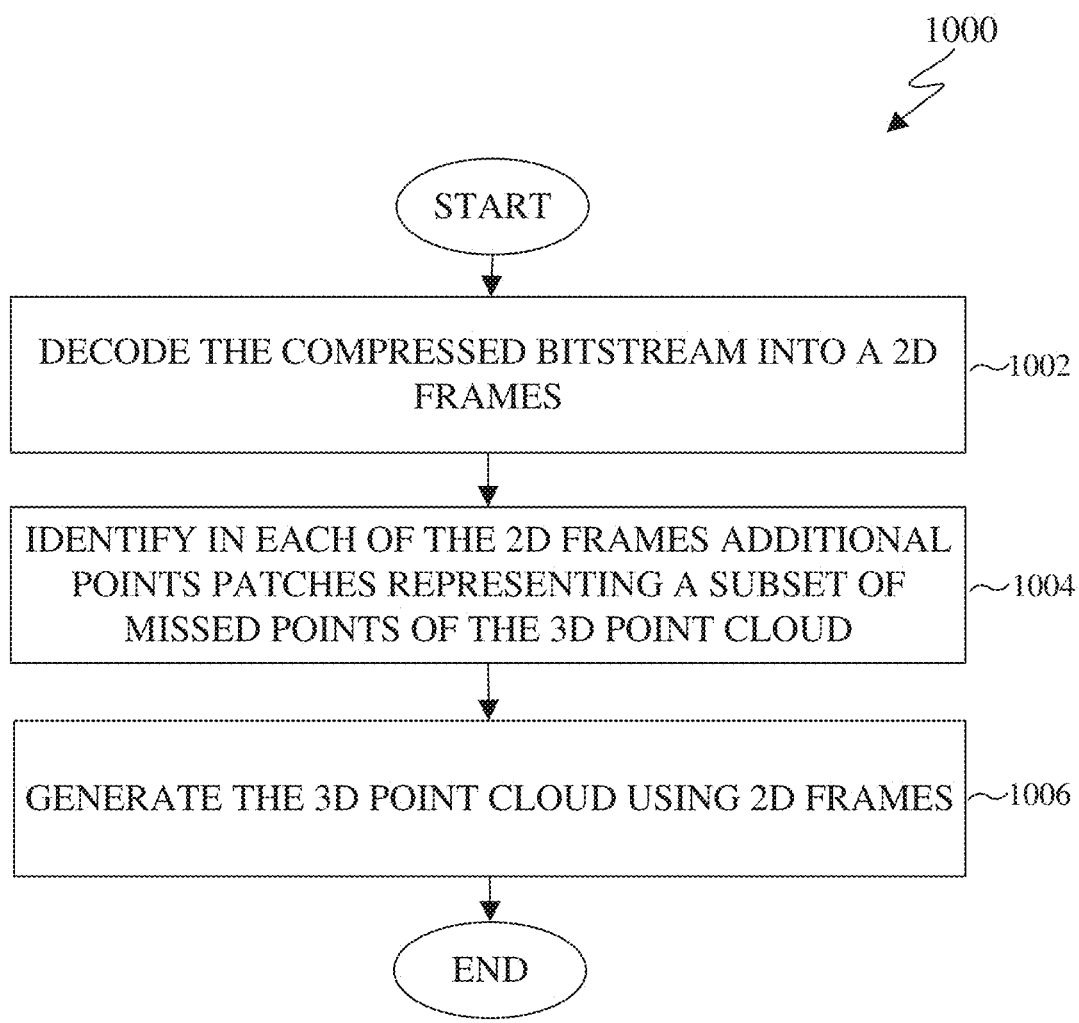
FIG. 10 illustrates an example method for decoding a point cloud in accordance with an embodiment of this disclosure.

FIG. 10 illustrates an example method for decoding a point cloud in accordance with an embodiment of this disclosure.

The method 1000 can be performed by the server 104 or any of the client devices 106-116 of FIG. 1, the server 200 of FIG. 2, the electronic device 300 of FIG. 3, the decoder 550 of FIGS. 5A, 5C, and 5D, or any other suitable device or system. For ease of explanation, the method 1000 is described as being performed by the decoder 550 of FIGS. 5A, 5C, and 5D.

The process begins with the decoder, such as decoder 550, receiving a compressed bitstream (step 1002). The received bitstream can include an encoded point cloud that was mapped onto multiple 2-D frames, compressed, and then transmitted and ultimately received by the decoder 550.

In step 1004, the decoder 550 decodes the bitstream to identify the additional points patches within the frames. The additional points patches represent a set of the missed points. For example, the additional points patches can include all or a portion of the missed points. In certain embodiments, the additional points patches is not included in the frames.

The decoder 550 can identify the additional points patch in both the 2-D frames. The additional points patch represents points of the 3D point cloud that are not included in the regular patches. For example, the first set of 2D frames can include an additional points patch that represents geometry of points of the 3D point cloud. The second set of 2D frames can include an additional points patch that represents texture of points of the 3D point cloud. The additional point patches represent points of the 3D point cloud that were not included in the frames.

In step 1006, the decoder 550 generates from the 2D frames the 3D point cloud using the regular patches and the additional points patches. For example, the decoder 550 generates the geometry of the point cloud using the regular patches that represent geometry. Thereafter the decoder 550 fills in the holes or cracks with the information from the additional points patch. Then the decoder 550 colors the point cloud using the information from the regular patches representing texture and the additional points patches representing texture.

Although FIG. 10 illustrates one example of a method 1000 for point decoding, various changes may be made to FIG. 10. For example, while shown as a series of steps, various steps in FIG. 10 could overlap, occur in parallel, or occur any number of times.

Although the figures illustrate different examples of user equipment, various changes may be made to the figures. For example, the user equipment can include any number of each component in any suitable arrangement. In general, the figures do not limit the scope of this disclosure to any particular configuration(s). Moreover, while figures illustrate operational environments in which various user equipment features disclosed in this patent document can be used, these features can be used in any other suitable system.

None of the description in this application should be read as implying that any particular element, step, or function is an essential element that must be included in the claim scope. The scope of patented subject matter is defined only by the claims. Moreover, none of the claims is intended to invoke 35 U.S.C. § 112(f) unless the exact words "means for" are followed by a participle. Use of any other term, including without limitation "mechanism," "module," "device," "unit," "component," "element," "member," "apparatus," "machine," "system," "processor," or "controller," within a claim is understood by the applicants to refer to structures known to those skilled in the relevant art and is not intended to invoke 35 U.S.C. § 112(f).

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An encoding device for point cloud encoding, the encoding device comprising:
 a processor configured to:
  generate, for a three-dimensional (3D) point cloud, a first two-dimensional (2D) frame representing a first attribute of the 3D point cloud and a second 2D frame representing a second attribute of the 3D point cloud, wherein the first 2D frame and the second 2D frame include respective clusters of projected points from the 3D point cloud,
  detect missed points of the 3D point cloud that are not included in the first 2D frame,
  generate a first additional points patch representing the first attribute based on at least a subset of the missed points and a second additional points patch representing the second attribute based on at least the subset of the missed points,
  include the first additional points patch in the first 2D frame and the second additional points patch in the second 2D frame, and
  encode the first 2D frame that include the first additional points patch and the second 2D frame that includes the second additional points patch to generate a compressed bitstream, and
 a communication interface operably coupled to the processor, the communication interface configured to transmit the compressed bitstream.

2. The encoding device of claim 1, wherein the processor is further configured to:
  for each of the missed points, identify a quantity of points within a predefined zone surrounding a respective point of the missed points;
  identify a distance between the respective point and the points within the predefined zone, wherein the distance is based on a proximity parameter;
  derive a relationship indicating a density score between the respective point and the points within the predefined zone based on the distance; and
  include the respective point in the subset of the missed points, when the quantity of points surrounding the respective point is greater than a threshold, and the relationship between the respective point and the points within the predefined zone.

3. The encoding device of claim 2, wherein the proximity parameter indicates that the distance between the respective point and the points within the predefined zone are based on at least one of:
  the first attribute, and
  the second attribute,
  wherein the first attribute is geometry and the second attribute is color.

4. The encoding device of claim 2, wherein:
  to derive the relationship, the processor is further configured to:
    combine an inverse of the distance between the respective point and each of the points within the predefined zone, wherein the relationship rewards the points that are within a first distance and penalizes the points that are within a second distance, wherein the first distance is smaller than the second distance, and
  the processor is further configured to:
    identify a score, indicating a percentage of points of the missed points to include in the first and second additional points patches, wherein when the score is a first level all of the missed points are included in the first and second additional points patches, when the score is a second level, none of the missed points are included in the first and second additional points patches, and when the score is between the first level and the second level, a corresponding portion of the missed points are included in the first and second additional points patches.

5. The encoding device of claim 1, wherein:
  to encode the first 2D frame that includes the first additional points patch, the processor is further configured to:
    apply a first quantization parameter to the clusters of projected points represented in the first 2D frame, and
    apply a second quantization parameter to the first additional points patch in the first 2D frame;
  to encode the second 2D frame that includes the second additional points patch, the processor is further configured to, apply a third quantization parameter to the clusters of projected points represented in the second 2D frame and the second additional points patch;
  the first quantization parameter is larger than the second quantization parameter;
  the third quantization parameter is equal to, greater than, or less than the first quantization parameter; and
  the first 2D frame representing the first attribute corresponds to geometry of the 3D point cloud.

6. The encoding device of claim 1, wherein the processor is further configured to:
  receive an indication of a region of interest (ROI) of the 3D point cloud;
  identify a set of points that are within the ROI;
  for each point included in the set of points, identify a quantity of points within a predefined zone surrounding a respective point;
  identify a distance between the respective point and the points within the predefined zone, wherein the distance is based on a proximity parameter;
  derive a relationship indicating a density score between the respective point and the points within the predefined zone; and
  include the respective point in a first ROI patch representing the first attribute and a second ROI patch representing the second attribute, when the quantity of points surrounding the respective point is greater than a threshold, and the relationship between the respective point and the points within the predefined zone.

7. The encoding device of claim 1, wherein the processor is further configured to:
  sort the missed points based on a geometric distance between a first missed point and a second missed point; and
  after sorting the missed points, generate the first additional points patch and the second additional points patch.

8. The encoding device of claim 1, wherein to generate the compressed bitstream, the processor is further configured to:
  compress the first 2D frame and the second 2D frame based on lossy compression.

9. The encoding device of claim 1, wherein the processor is configured to:
  generate a first additional 2D frame representing the first attribute and a second additional 2D frame representing the second attribute; and
  include the first additional points patch in the first additional 2D frame and the second additional points patch in the second additional 2D frame.

10. The encoding device of claim 1, wherein:
  the first attribute is represented by a first set of frames, wherein the first 2D frame is included in the first set of frames;
  the second attribute is represented by a second set of frames wherein the second 2D frame is included in the second set of frames; and
  the processor is further configured to:
    include the first additional points patch in at least one of the first set of frames, and
    include the second additional points patch in at least one of the second set of frames.

11. A decoding device for point cloud decoding, the decoding device comprising:
  a communication interface configured to receive a compressed bitstream; and
  a processor operably coupled to the communication interface, wherein the processor is configured to:
    decode the compressed bitstream into a first two-dimensional (2D) frame representing a first attribute of a three-dimensional (3D) point cloud and a second 2D frame representing a second attribute of the 3D point cloud, wherein the first 2D frame and the second 2D frame include respective clusters of projected points from the 3D point cloud,
    identify in the first 2D frame a first additional points patch representing a subset of missed points of the 3D point cloud that are not included in the first 2D frame and in the second 2D frame a second additional points patch representing the subset of the missed points of the 3D point cloud that are not included in the first 2D frame, and generate, using the first 2D frame and the second 2D frame, the 3D point cloud using the respective clusters of projected points, the first additional points patch, and the second additional points patch.

12. The decoding device of claim 11, wherein the subset of the missed points of the 3D point cloud include at least one point when a quantity of points within a predefined zone that surround the point is greater than a threshold, and a relationship indicating a density score between the point and the points within the predefined zone.

13. The decoding device of claim 11, wherein to generate the 3D point cloud, the processor is further configured to:
    identify a first quantization parameter and a second quantization parameter included in the compressed bitstream;
    apply the first quantization parameter to the clusters of projected points represented in the first 2D frame; and
    apply the second quantization parameter to the first additional points patch in the first 2D frame,
    wherein the first quantization parameter is larger than the second quantization parameter, and
    wherein the first 2D frame representing the first attribute corresponds to geometry of the 3D point cloud.

14. The decoding device of claim 11, wherein the processor is further configured to:
    receive an indication of a region of interest (ROI) of the 3D point cloud;
    identify a first ROI patch representing the first attribute and a second ROI patch representing the second attribute; and
    generate, using the first 2D frame and the second 2D frame, the 3D point cloud using the respective clusters of projected points, the first additional points patch, the second additional points patch, the first ROI patch, and the second ROI patch.

15. A method for point cloud encoding, comprising:
    generating, for a three-dimensional (3D) point cloud, a first two-dimensional (2D) frame representing a first attribute of the 3D point cloud and a second 2D frame representing a second attribute of the 3D point cloud, wherein the first 2D frame and the second 2D frame include respective clusters of projected points from the 3D point cloud;
    detecting missed points of the 3D point cloud that are not included in the first 2D frame;
    generating a first additional points patch representing the first attribute based on at least a subset of the missed points and a second additional points patch representing the second attribute based on at least the subset of the missed points;
    including the first additional points patch in the first 2D frame and the second additional points patch in the second 2D frame;
    encoding the first 2D frame that include the first additional points patch and the second 2D frame that includes the second additional points patch to generate a compressed bitstream; and
    transmitting the compressed bitstream.

16. The method of claim 15, further comprising:
    for each of the missed points, identify a quantity of points within a predefined zone surrounding a respective point of the missed points;
    identify a distance between the respective point and the points within the predefined zone, wherein the distance is based on a proximity parameter;
    derive a relationship indicating a density score between the respective point and the points within the predefined zone based on the distance; and
    include the respective point in the subset of the missed points, when the quantity of points surrounding the respective point is greater than a threshold, and the relationship between the respective point and the points within the predefined zone.

17. The method of claim 16, wherein the proximity parameter indicates that the distance between the respective point and the points within the predefined zone are based on at least one of:
    the first attribute, and
    the second attribute,
    wherein the first attribute is geometry and the second attribute is color.

18. The method of claim 16, wherein:
    deriving the relationship comprises combining an inverse of the distance between the respective point and each of the points within the predefined zone, wherein the relationship rewards the points that are within a first distance and penalizes the points that are within a second distance, wherein the first distance is smaller than the second distance, and
    the method further comprises identifying a score, indicating a percentage of points of the missed points to include in the first and second additional points patches, wherein when the score is a first level all of the missed points are included in the first and second additional points patches, when the score is a second level, none of the missed points are included in the first and second additional points patches, and when the score is between the first level and the second level, a corresponding portion of the missed points are included in the first and second additional points patches.

19. The method claim 15, wherein encoding the first 2D frame comprises:
    applying a first quantization parameter to the clusters of projected points represented in the first 2D frame;
    applying a second quantization parameter to the first additional points patch in the first 2D frame; and
    applying a third quantization parameter to the clusters of projected points represented in the second 2D frame and the second additional points patch,
    wherein the first quantization parameter is larger than the second quantization parameter,
    wherein the third quantization parameter is equal to, greater than, or less than the first quantization parameter, and
    wherein the first 2D frame representing the first attribute corresponds to geometry of the 3D point cloud.

20. The method claim 15, further comprising:
    sorting the missed points based on a geometric distance between a first missed point and a second missed point; and
    after sorting the missed points, generating the first additional points patch and the second additional points patch.

* * * * *